(12) United States Patent
Yoshinaga

(10) Patent No.: US 6,360,341 B1
(45) Date of Patent: Mar. 19, 2002

(54) EDITING APPARATUS AND GENERATING METHOD FOR PHYSICAL CONVERSION DEFINITION

(75) Inventor: Masayuki Yoshinaga, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/268,238

(22) Filed: Mar. 15, 1999

(30) Foreign Application Priority Data

Mar. 25, 1998 (JP) .......................................... 10-096804

(51) Int. Cl.[7] .............................................. G11C 29/00
(52) U.S. Cl. ....................................... 714/718; 714/723
(58) Field of Search ................................ 714/718, 723; 365/200, 201

(56) References Cited

U.S. PATENT DOCUMENTS

| 5,548,557 | A | * | 8/1996 | Futatsuya et al. | ............ 365/201 |
| 6,065,143 | A | * | 6/2000 | Yamasaki et al. | ............ 714/720 |

* cited by examiner

*Primary Examiner*—Phung M. Chung
(74) *Attorney, Agent, or Firm*—Dellett and Walters

(57) ABSTRACT

This specification discloses the editing apparatus and generating method for physical conversion definition for generating physical conversion definition for obtaining a logical address from a physical address in semiconductor memory. After setting address parameters relating to contents for setting the physical address and logical address, a plurality of elements whose structural unit is one memory cell of the semiconductor memory or a plurality of memory cells adjacent to each other are set. Furthermore, a logical address is specified to each of these elements. Owing to this, a layout composed of the plurality of elements is generated.

16 Claims, 33 Drawing Sheets

FIG. 8

《area A》

| d1 | 1 | | 0 | |
|---|---|---|---|---|
| y3 | 1 | 0 | 1 | 0 |

| | E | F | E | F |
|---|---|---|---|---|
| | E | F | E | F |
| | E | F | E | F |
| | E | F | E | F | x5 d0

| 0 | 0 |
|---|---|
| 1 | |
| | 1 |
| 0 | |
| 1 | 0 |

FIG. 9

《area B》
Inverting y3 in the area A

| d1 | 1 | | 0 | |
|---|---|---|---|---|
| y3 | 0 | 1 | 0 | 1 |

| E | F | E | F |
|---|---|---|---|
| E | F | E | F |
| E | F | E | F |
| E | F | E | F | x5 d0

| 0 | 0 |
|---|---|
| 1 | |
| | 1 |
| 0 | |
| 1 | 0 |

FIG. 10

《area C》
Inverting x5, y0, y1, y3, d1 in the areaA

| d1 | 0 | | 1 | |
|---|---|---|---|---|
| y3 | 0 | 1 | 0 | 1 |

|   |   |   |   | x5 | d0 |
|---|---|---|---|---|---|
| G | H | G | H | 1 | 0 |
| G | H | G | H | 0 |   |
|   |   |   |   |   | 1 |
| G | H | G | H | 1 |   |
| G | H | G | H | 0 | 0 |

FIG. 11

《area D》
Inverting x5, y0, y1, d1 in the area A

| d1 | 0 | | 1 | |
|---|---|---|---|---|
| y3 | 1 | 0 | 1 | 0 |

|   |   |   |   | x5 | d0 |
|---|---|---|---|---|---|
| G | H | G | H | 1 | 0 |
| G | H | G | H | 0 |   |
|   |   |   |   |   | 1 |
| G | H | G | H | 1 |   |
| G | H | G | H | 0 | 0 |

《areaG》
Inverting y0, y1 in the area E

《areaH》
Inverting x0, x1, x2, x3, y0, y1 in the area E

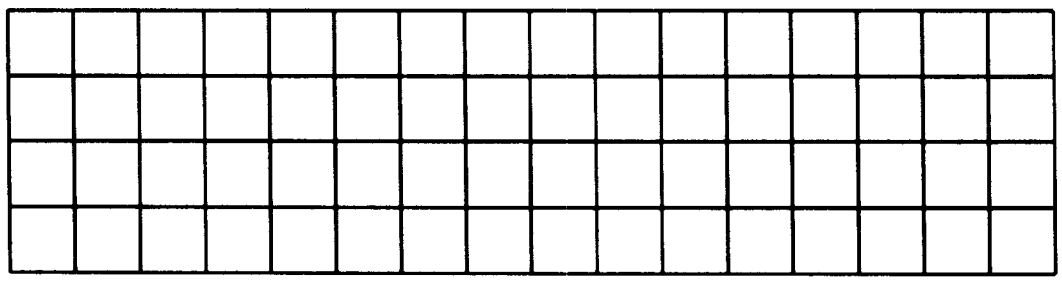
F I G. 20

ELEMENTS BEING x0=1 ARE SELECTED, AND x0=1 IS SPECIFIED.

ELEMENTS BEING x1=1 ARE SELECTED, AND x1=1 IS SPECIFIED.

ELEMENTS BEING x2=1 ARE SELECTED, AND x2=1 IS SPECIFIED.

ELEMENTS BEING x3=1 ARE SELECTED, AND x3=1 IS SPECIFIED.

ELEMENTS BEING y0=1 ARE SELECTED, AND y0=1 IS SPECIFIED.

ELEMENTS BEING y1=1 ARE SELECTED, AND y1=1 IS SPECIFIED.

FIG. 23A

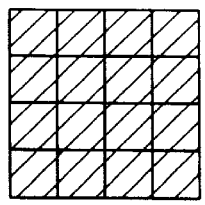

ALL THE ELEMENTS ARE SELECTED,
AND "sub block" IS SPECIFIED
AS THE LAYOUT NAME

FIG. 23B

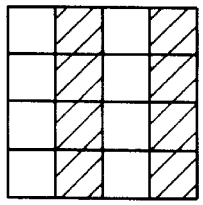

THE ELEMENTS CORRESPONDING TO
THE area F ARE SELECTED,
AND x0=1, x1=1, x2=1, x3=1
ARE SPECIFIED

FIG. 23C

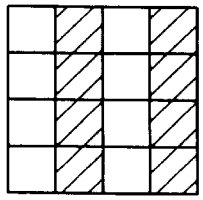

THE ELEMENTS BEING y3=1,
ARE SELECTED,
AND y3=1 IS SPECIFIED

FIG. 23D

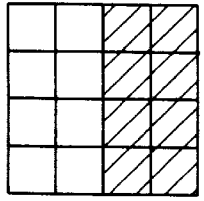

THE ELEMENTS BEING d1=1,
ARE SELECTED,
AND d1=1 IS SPECIFIED

FIG. 23E

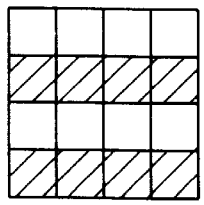

THE ELEMENTS BEING x5=1,
ARE SELECTED,
AND x5=1 IS SPECIFIED

FIG. 23F

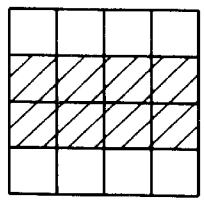

THE ELEMENTS BEING d0=1,
ARE SELECTED,
AND d0=1 IS SPECIFIED

F I G. 24

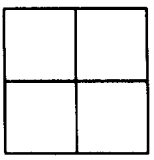

F I G. 25A

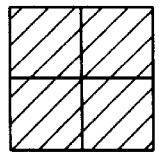 ALL THE ELEMENTS ARE SELECTED,
AND "block" IS SPECIFIED
AS THE LAYOUT NAME

F I G. 25B

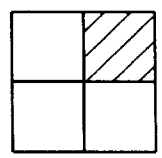 THE ELEMENTS CORRESPONDING TO
THE area B ARE SELECTED,
AND y3=1 IS SPECIFIED

F I G. 25C

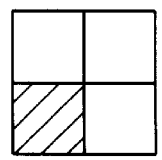 THE ELEMENTS CORRESPONDING TO
THE area C ARE SELECTED,
AND x5=1, y0=1, y1=1, y3=1, d1=1
ARE SPECIFIED

F I G. 25D

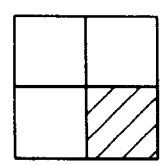 THE ELEMENTS CORRESPONDING TO
THE area D ARE SELECTED,
AND x5=1, y0=1, y1=1, d1=1
ARE SPECIFIED

F I G. 25E

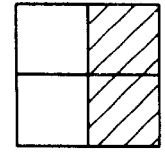 THE ELEMENTS BEING x4=1,
AND x4=1 IS SPECIFIED

F I G. 25F

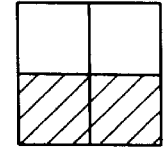 THE ELEMENTS BEING y2=1,
AND y2=1 IS SPECIFIED

THE CASE OF THE ORIGIN OF THE LOGICAL ADDRESS IN THE UNIT IS ON THE UPPER LEFT

THE CASE OF THE ORIGIN OF THE LOGICAL ADDRESS IN THE UNIT IS ON THE UPPER RIGHT

THE CASE OF THE ORIGIN OF THE LOGICAL ADDRESS IN THE UNIT IS ON THE LOWER LEFT

THE CASE OF THE ORIGIN OF THE LOGICAL ADDRESS IN THE UNIT IS ON THE LOWER RIGHT

BLOCK LAYOUT "Block 0"

BLOCK LAYOUT "Block 1"

THE UNITS BEING d0=1 ARE SELECTED,
AND d0=1 IS SPECIFIED

THE UNITS BEING d1=1 ARE SELECTED,
AND d1=1 IS SPECIFIED

THE UNITS THAT ORIGIN IS ON THE UPPER RIGHT
ARE SELECTED, AND SPECIFY THE ORIGIN IS ON
THE UPPER RIGHT

FIG. 39

THE UPPER TWO BLOCKS ARE SELECTED
AND "Block0" ARE SPECIFIED,
THE LOWER TWO BLOCKS ARE SELECTED
AND "Block1" ARE SPECIFIED

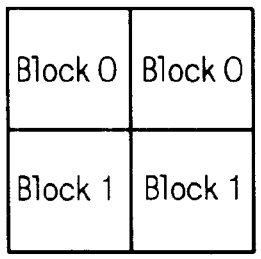

| F 0<br>8<br>B (2) | 0 F<br>0<br>3 (2) | F 0<br>8<br>B (0) | 0 F<br>0<br>3 (0) | F 0<br>8<br>B (2) | 0 F<br>0<br>3 (2) | F 0<br>8<br>B (0) | 0 F<br>0<br>3 (0) |
|---|---|---|---|---|---|---|---|
| 2F 20<br>8<br>B (3) | 20 2F<br>0<br>3 (3) | 2F 20<br>8<br>B (1) | 20 2F<br>0<br>3 (1) | 2F 20<br>8<br>B (3) | 20 2F<br>0<br>3 (3) | 2F 20<br>8<br>B (1) | 20 2F<br>0<br>3 (1) |
| F 0<br>8<br>B (3) | 0 F<br>0<br>3 (3) | F 0<br>8<br>B (1) | 0 F<br>0<br>3 (1) | F 0<br>8<br>B (3) | 0 F<br>0<br>3 (3) | F 0<br>8<br>B (1) | 0 F<br>0<br>3 (1) |
| 2F 20<br>8<br>B (2) | 20 2F<br>0<br>3 (2) | 2F 20<br>8<br>B (0) | 20 2F<br>0<br>3 (0) | 2F 20<br>8<br>B (2) | 20 2F<br>0<br>3 (2) | 2F 20<br>8<br>B (0) | 20 2F<br>0<br>3 (0) |
| 2F 20<br>3<br>0 (0) | 20 2F<br>B<br>8 (0) | 2F 20<br>3<br>0 (2) | 20 2F<br>B<br>8 (2) | 2F 20<br>3<br>0 (0) | 20 2F<br>B<br>8 (0) | 2F 20<br>3<br>0 (2) | 20 2F<br>B<br>8 (2) |
| F 0<br>3<br>0 (1) | 0 F<br>B<br>8 (1) | F 0<br>3<br>0 (3) | 0 F<br>B<br>8 (3) | F 0<br>3<br>0 (1) | 0 F<br>B<br>8 (1) | F 0<br>3<br>0 (3) | 0 F<br>B<br>8 (3) |
| 2F 20<br>3<br>0 (1) | 20 2F<br>B<br>8 (1) | 2F 20<br>3<br>0 (3) | 20 2F<br>B<br>8 (3) | 2F 20<br>3<br>0 (1) | 20 2F<br>B<br>8 (1) | 2F 20<br>3<br>0 (3) | 20 2F<br>B<br>8 (3) |
| F 0<br>3<br>0 (0) | 0 F<br>B<br>8 (0) | F 0<br>3<br>0 (2) | 0 F<br>B<br>8 (2) | F 0<br>3<br>0 (0) | 0 F<br>B<br>8 (0) | F 0<br>3<br>0 (2) | 0 F<br>B<br>8 (2) |

FIG. 40

UNITS BEING x4=1 ARE SELECTED,
AND x4=1 IS SPECIFIED

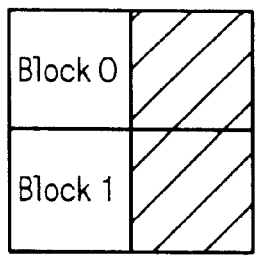

| F 0<br>8<br>B (2) | 0 F<br>0<br>3 (2) | F 0<br>8<br>B (0) | 0 F<br>0<br>3 (0) | 1F 10<br>8<br>B (2) | 10 1F<br>0<br>3 (2) | 1F 10<br>8<br>B (0) | 10 1F<br>0<br>3 (0) |
|---|---|---|---|---|---|---|---|
| 2F 20<br>8<br>B (3) | 20 2F<br>0<br>3 (3) | 2F 20<br>8<br>B (1) | 20 2F<br>0<br>3 (1) | 3F 30<br>8<br>B (3) | 30 3F<br>0<br>3 (3) | 3F 30<br>8<br>B (1) | 30 3F<br>0<br>3 (1) |
| F 0<br>8<br>B (3) | 0 F<br>0<br>3 (3) | F 0<br>8<br>B (1) | 0 F<br>0<br>3 (1) | 1F 10<br>8<br>B (3) | 10 1F<br>0<br>3 (3) | 1F 10<br>8<br>B (1) | 10 1F<br>0<br>3 (1) |
| 2F 20<br>8<br>B (2) | 20 2F<br>0<br>3 (2) | 2F 20<br>8<br>B (0) | 20 2F<br>0<br>3 (0) | 3F 30<br>8<br>B (2) | 30 3F<br>0<br>3 (2) | 3F 30<br>8<br>B (0) | 30 3F<br>0<br>3 (0) |
| 2F 20<br>3<br>0 (0) | 20 2F<br>B<br>8 (0) | 2F 20<br>3<br>0 (2) | 20 2F<br>B<br>8 (2) | 3F 30<br>3<br>0 (0) | 30 3F<br>B<br>8 (0) | 3F 30<br>3<br>0 (2) | 30 3F<br>B<br>8 (2) |
| F 0<br>3<br>0 (1) | 0 F<br>B<br>8 (1) | F 0<br>3<br>0 (3) | 0 F<br>B<br>8 (3) | 1F 10<br>3<br>0 (1) | 10 1F<br>B<br>8 (1) | 1F 10<br>3<br>0 (3) | 10 1F<br>B<br>8 (3) |
| 2F 20<br>3<br>0 (1) | 20 2F<br>B<br>8 (1) | 2F 20<br>3<br>0 (3) | 20 2F<br>B<br>8 (3) | 3F 30<br>3<br>0 (1) | 30 3F<br>B<br>8 (1) | 3F 30<br>3<br>0 (3) | 30 3F<br>B<br>8 (3) |
| F 0<br>3<br>0 (0) | 0 F<br>B<br>8 (0) | F 0<br>3<br>0 (2) | 0 F<br>B<br>8 (2) | 1F 10<br>3<br>0 (0) | 10 1F<br>B<br>8 (0) | 1F 10<br>3<br>0 (2) | 10 1F<br>B<br>8 (2) |

*FIG. 41*
UNITS BEING y2=1 ARE SELECTED,
AND y2=1 IS SPECIFIED
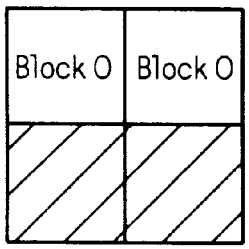
| F 0 8 B (2) | 0 F 0 3 (2) | F 0 8 B (0) | 0 F 0 3 (0) | 1F 10 8 B (2) | 10 1F 0 3 (2) | 1F 10 8 B (0) | 10 1F 0 3 (0) |
|---|---|---|---|---|---|---|---|
| 2F 20 8 B (3) | 20 2F 0 3 (3) | 2F 20 8 B (1) | 20 2F 0 3 (1) | 3F 30 8 B (3) | 30 3F 0 3 (3) | 3F 30 8 B (1) | 30 3F 0 3 (1) |
| F 0 8 B (3) | 0 F 0 3 (3) | F 0 8 B (1) | 0 F 0 3 (1) | 1F 10 8 B (3) | 10 1F 0 3 (3) | 1F 10 8 B (1) | 10 1F 0 3 (1) |
| 2F 20 8 B (2) | 20 2F 0 3 (2) | 2F 20 8 B (0) | 20 2F 0 3 (0) | 3F 30 8 B (2) | 30 3F 0 3 (2) | 3F 30 8 B (0) | 30 3F 0 3 (0) |
| 2F 20 7 4 (0) | 20 2F F C (0) | 2F 20 7 4 (2) | 20 2F F C (2) | 3F 30 7 4 (0) | 30 3F F C (0) | 3F 30 7 4 (2) | 30 3F F C (2) |
| F 0 7 4 (1) | 0 F F C (1) | F 0 7 4 (3) | 0 F F C (3) | 1F 10 7 4 (1) | 10 1F F C (1) | 1F 10 7 4 (3) | 10 1F F C (3) |
| 2F 20 7 4 (1) | 20 2F F C (1) | 2F 20 7 4 (3) | 20 2F F C (3) | 3F 30 7 4 (1) | 30 3F F C (1) | 3F 30 7 4 (3) | 30 3F F C (3) |
| F 0 7 4 (0) | 0 F F C (0) | F 0 7 4 (2) | 0 F F C (2) | 1F 10 7 4 (0) | 10 1F F C (0) | 1F 10 7 4 (2) | 10 1F F C (2) |

UPPER RIGHT BLOCKS AND LOWER RIGHT BLOCKS
ARE SELECTED, AND y3=1 IS SPECIFIED.
OWING TO THIS, THE y3 BIT ASSIGNED TO
UNITS IN A BLOCK LAYOUT IS MADE TO BE INVERTED.

| F 0 8 B (2) | 0 F 0 3 (2) | F 0 8 B (0) | 0 F 0 3 (0) | 1F 10 0 3 (2) | 10 1F 8 B (2) | 1F 10 0 3 (0) | 10 1F 8 B (0) |
|---|---|---|---|---|---|---|---|
| 2F 20 8 B (3) | 20 2F 0 3 (3) | 2F 20 8 B (1) | 20 2F 0 3 (1) | 3F 30 0 3 (3) | 30 3F 8 B (3) | 3F 30 0 3 (1) | 30 3F 8 B (1) |
| F 0 8 B (3) | 0 F 0 3 (3) | F 0 8 B (1) | 0 F 0 3 (1) | 1F 10 0 3 (3) | 10 1F 8 B (3) | 1F 10 0 3 (1) | 10 1F 8 B (1) |
| 2F 20 8 B (2) | 20 2F 0 3 (2) | 2F 20 8 B (0) | 20 2F 0 3 (0) | 3F 30 0 3 (2) | 30 3F 8 B (2) | 3F 30 0 3 (0) | 30 3F 8 B (0) |
| 2F 20 7 4 (0) | 20 2F F C (0) | 2F 20 7 4 (2) | 20 2F F C (2) | 3F 30 F C (0) | 30 3F 7 4 (0) | 3F 30 F C (2) | 30 3F 7 4 (2) |
| F 0 7 4 (1) | 0 F F C (1) | F 0 7 4 (3) | 0 F F C (3) | 1F 10 F C (1) | 10 1F 7 4 (1) | 1F 10 F C (3) | 10 1F 7 4 (3) |
| 2F 20 7 4 (1) | 20 2F F C (1) | 2F 20 7 4 (3) | 20 2F F C (3) | 3F 30 F C (1) | 30 3F 7 4 (1) | 3F 30 F C (3) | 30 3F 7 4 (3) |
| F 0 7 4 (0) | 0 F F C (0) | F 0 7 4 (2) | 0 F F C (2) | 1F 10 F C (0) | 10 1F 7 4 (0) | 1F 10 F C (2) | 10 1F 7 4 (2) |

BLOCK LAYOUT A

BLOCK LAYOUT B

FIG. 48

THE CASE OF THE PRIORITY
DIRECTION IN ADDRESS ASSIGNMENT
IS THE HORIZONTAL DIRECTION

X →
Y ↓

| 2 3<br>0<br>3 (0) | 0 : 24 31<br>: 0<br>3 (0) | 0 7 : 31<br>0 : 0<br>3 (2) : 3 | 8<br>(2) |
|---|---|---|---|
| 2 3<br>0<br>3 (1) | 0 : 24 31<br>: 0<br>3 (1) | 0 7 : 31<br>0 : 0<br>3 (3) : 3 | 8<br>(3) |
| 2 3<br>4<br>7 (0) | 0 : 24 31<br>: 4<br>7 (0) | 0 7 : 31<br>4 : 4<br>7 (2) : 7 | 8<br>(2) |
| 2 3<br>4<br>7 (1) | 0 : 24 31<br>: 4<br>7 (1) | 0 7 : 31<br>4 : 4<br>7 (3) : 7 | 8<br>(3) |
| 0 7 : 31<br>8 : 8<br>11 (2) : 11 | 8<br>(2) | 2 3<br>8<br>11 | 0 : 24 31<br>: 8<br>(0) : 11 (0) |
| 0 7 : 31<br>8 : 8<br>11 (3) : 11 | 8<br>(3) | 2 3<br>8<br>11 | 0 : 24 31<br>: 8<br>(1) : 11 (1) |
| 0 7 : 31<br>12 : 12<br>15 (2) : 15 | 8<br>(2) | 2 3<br>12<br>15 | 0 : 24 31<br>: 12<br>(0) : 15 (0) |
| 0 7 : 31<br>12 : 12<br>15 (3) : 15 | 8<br>(3) | 2 3<br>12<br>15 | 0 : 24 31<br>: 12<br>(1) : 15 (1) |

F I G. 49

| 20 2F<br>1<br>0  (0) | 00 0F<br>1<br>0  (0) | 30 3F<br>1<br>0  (0) | 10 1F<br>1<br>0  (0) |
|---|---|---|---|
| 20 2F<br>3<br>2  (0) | 00 0F<br>3<br>2  (0) | 30 3F<br>3<br>2  (0) | 10 1F<br>3<br>2  (0) |
| 20 2F<br>5<br>4  (0) | 00 0F<br>5<br>4  (0) | 30 3F<br>5<br>4  (0) | 10 1F<br>5<br>4  (0) |
| 20 2F<br>7<br>6  (0) | 00 0F<br>7<br>6  (0) | 30 3F<br>7<br>6  (0) | 10 1F<br>7<br>6  (0) |

F I G. 50

| 0  1F<br>0<br>F  (0) | 0  1F<br>0<br>F  (1) | 0  1F<br>0<br>F  (2) | 0  1F<br>0<br>F  (3) | 0  1F<br>0<br>F  (7) | 0  1F<br>0<br>F  (6) | 0  1F<br>0<br>F  (5) | 0  1F<br>0<br>F  (4) | 0  1F<br>0<br>F  (8) |
|---|---|---|---|---|---|---|---|---|
| 0  1F<br>1F<br>10 (0) | 0  1F<br>1F<br>10 (1) | 0  1F<br>1F<br>10 (2) | 0  1F<br>1F<br>10 (3) | 0  1F<br>1F<br>10 (7) | 0  1F<br>1F<br>10 (6) | 0  1F<br>1F<br>10 (5) | 0  1F<br>1F<br>10 (4) | 0  1F<br>1F<br>10 (8) |

F I G. 51

| 0  0F<br>0<br>F  (0) | 10 1F<br>0<br>F  (0) | 40 4F<br>0<br>F  (0) | 7F 70<br>0<br>F  (0) | 3F 30<br>0<br>F  (0) | 2F 20<br>0<br>F  (0) |
|---|---|---|---|---|---|
| 20 2F<br>1F<br>10 (0) | 00 0F<br>1F<br>10 (0) | 40 4F<br>1F<br>10 (0) | 7F 70<br>1F<br>10 (0) | 3F 30<br>1F<br>10 (0) | 2F 20<br>1F<br>10 (0) |

FIG. 52

THE CASE OF THE PRIORITY
DIRECTION IN ADDRESS ASSIGNMENT
IS THE VERTICAL DIRECTION

| 2 3 0 3 | 0 0 7 8 (0) 11 (0) | 0 7 0 3 (2) 23 0 3 | 0 (2) |
|---|---|---|---|
| 2 3 0 3 | 0 0 7 8 (1) 11 (1) | 0 7 0 3 (3) 23 0 3 | 0 (3) |
| 2 3 4 7 | 0 0 7 12 (0) 15 (0) | 0 7 4 7 (2) 23 4 7 | 0 (2) |
| 2 3 4 7 | 0 0 7 12 (1) 15 (1) | 0 7 4 7 (3) 23 4 7 | 0 (3) |
| 24 31 0 3 (2) | 47 8 11 | 24 (2) | 31 0 3 | 8 8 15 8 (0) 11 (0) |
| 24 31 0 3 (3) | 47 8 11 | 24 (3) | 31 0 3 | 8 8 15 8 (1) 11 (1) |
| 24 31 4 7 (2) | 47 12 15 | 24 (2) | 31 4 7 | 8 8 15 12 (0) 15 (0) |
| 24 31 4 7 (3) | 47 12 15 | 24 (3) | 31 4 7 | 8 8 15 12 (1) 15 (1) |

EDITING APPARATUS AND GENERATING METHOD FOR PHYSICAL CONVERSION DEFINITION

BACKGROUND OF THE INVENTION

The present invention relates to an editing apparatus and a generating method for physical conversion definition for generating physical conversion definition for converting a physical address of a memory cell in semiconductor memory into a logical address and an I/O number.

A semiconductor memory test system is a system to analyze a failure of each memory cell in semiconductor memory (hereinafter, this is simply called memory) by reading data from or writing data to each memory cell. In general, a semiconductor memory test system, as shown in FIG. 43, comprises a timing generator 110, a pattern generator 112, a waveform shaper 114, a logical comparator 116, and fail memory 118. An address and data generated by the pattern generator 112 are inputted to memory under test (MUT) after waveform-shaping by the waveform shaper 114. The logical comparator 116 compares data read from the MUT with an expected value outputted from the pattern generator 112, and judges pass or fail. The fail memory 118 saves fail information every address from a fail signal outputted from the logical comparator 116 and an address signal outputted from the pattern generator 112. A series of these operations are synchronized with a system clock inputted from the timing generator 110 into each unit.

In this manner, data relating to pass or fail of each memory cell of the MUT is saved in the fail memory 118 included in the semiconductor memory test system. Furthermore, failure analysis of the memory is performed by collecting the data and surveying contents of the data by a host system and the like.

By the way, physical arrangement of actual memory cells may be frequently different from address information inputted into memory (logical address). Therefore, even if the fail information saved in the fail memory 118, described above, is read, it is unknown which memory cell is defective.

A map showing a memory address where a failure is detected is called a "fail bit map." A fail bit map is separated into a logical fail bit map and a physical fail bit map. The logical fail bit map is a four-dimensional fail bit map where logical addresses X, Y, and Z, and an I/O number are used as coordinates, and becomes a three-dimensional map in case the logical address Z is not used. This logical fail bit map can be obtained on the basis of fail information read from the fail memory 118 described above. The physical fail bit map is a two-dimensional fail bit map where physical addresses X and Y are used as coordinates, and is used when physical arrangement of a defective memory cell of the memory is confirmed. Since the failure analysis of the memory is usually performed with using this physical fail bit map, it becomes necessary to convert a logical fail bit map obtained by the fail memory 118 into a physical fail bit map.

In general, conversion of a logical fail bit map into a physical fail bit map is called "physical conversion." In a broad sense, it is called physical conversion to obtain a two-dimensional fail bit map with using a logical fail bit map and a physical conversion definition. Here, physical conversion definition means information for performing the physical conversion, the information which includes information for rapidly obtaining logical addresses and an I/O number from a physical address.

The physical conversion definition described above is performed with using an editing apparatus for physical conversion definition. Hereinafter, a generating method for physical conversion definition with using a conventional editing apparatus for physical conversion definition will be described.

(1) Setting of Address Parameters'

First, various address parameters are set. Concretely, the following parameters are set:

Size of horizontal logical address: HL
Size of vertical logical address: VL
I/O size: IO
Size of horizontal physical address: HP
Size of vertical physical address: VP
Axes of address Here, respective values are set so that formula $HL \times VL \times IO = HP \times VP$ may hold. For example, $HL=32$, $VL=16$, $IO=4$, $HP=64$, and $VP=32$ are set, and the X-axis is set in the horizontal direction and the Y-axis is set in the vertical direction.

(2) Generation of Unit Layout

Next, a unit layout will be generated. This unit layout has three kinds of information, that is, width, height, and a position of an origin. Although a plurality of units whose sizes are different from each other are allowed, unit layouts besides a basic unit layout that is smallest are integer times as large as the basic unit layout.

FIGS. 44A and 44B are diagrams showing concrete examples of the unit layout. As for a unit layout "a" shown in FIG. 44A, width is set at 24, height is at 4, and an origin is set on the upper right. In addition, as for a unit layout "b" shown in FIG. 44B, width is set at 8, height is at 4, and the origin is on the upper left.

(3) Generation of Block Layout

Next, a block layout is generated. The block layout is a layout where a plurality of units is arranged in a grid-like pattern, and a unit layout and an I/O number are assigned to each unit. It is not necessary that sizes of units included in a block are uniform so long as height or width of each row or each column is uniform.

FIGS. 45A and 45B are diagrams showing concrete examples of the block layout. A block layout A shown in FIG. 45A is set at 2 columns and 4 rows, and is composed by combining the unit layout "a," shown in FIG. 44A, with the unit layout b, shown in FIG. 44B, in the horizontal direction and alternately combining unit layouts, which have I/O numbers 0 and 1, in the vertical direction. Therefore, the width of the block layout A is set at 32 and the height is at 16. Similarly, the width of a block layout B shown in FIG. 45B is set at 2 columns and 4 rows, and is composed by combining the unit layout "a", shown in FIG. 44A, with the unit layout "b", shown in FIG. 44B, in the horizontal direction and alternately combining unit layouts, which have I/O numbers 2 and 3, in the vertical direction. Therefore, the width of the block layout B is set at 32 and the height is at 16.

(4) Generation of Main Layout

Next, a main layout is generated. The main layout is a layout where a plurality of blocks is arranged in a grid-like pattern, and a block layout and a sequence number are assigned to each block. Since sequence is meaningful for the sequence number, repeated numbers are not allowable. Block layouts assigned to blocks should have the same numbers of units in the horizontal direction and also in the vertical directions respectively, and furthermore, should have same numbers of memory cells in the horizontal direction and also in the vertical directions respectively.

FIG. 46 is a diagram showing a concrete example of a main layout. In the main layout shown in FIG. 46, respective block numbers in the horizontal and vertical directions are set at 2, and the main layout is composed of combining the block layouts A and B with the block layouts B and A. In addition, the sequence number "1" is set to the block layout A on the upper left, "4" is to the block layout A on the lower right, "7" is to the block layout B on the upper right, and "9" is to the block layout B on the lower left.

(5) Setting of Priority Direction in Address Assignment

Subsequently, either the horizontal direction or the vertical direction is set as the priority direction in address assignment.

After terminating the definition work by above operations (1) through (5), logical addresses X and Y are automatically assigned according to the following rules:

The origin of a physical address should be always on the upper left.

If the horizontal direction is X and the vertical direction is Y, the horizontal direction should be X and the vertical direction should be Y also in a physical address and a logical address. On the contrary, if the horizontal direction is Y and the vertical direction is X, the horizontal direction should be Y and the vertical direction should be X also in a physical address and a logical address.

A logical address should be sequentially assigned from a low address.

If the priority direction in address assignment is the horizontal direction, assignment of a logical address in the horizontal direction should be preferred. On the contrary, if the priority direction in address assignment is the vertical direction, assignment of a logical address in the vertical direction should be preferred.

When an address in the priority direction reaches the maximum value in the direction, the address in the priority direction should become 0 and an address in the non-priority direction should become a value obtained by adding one to the address lastly assigned.

A logical address should be sequentially assigned from the block having the smallest sequence number.

The logical address should be assigned from a unit on the upper left in a block.

If the priority direction in address assignment is the horizontal direction, logical addresses are assigned to units in a block in the order of priority of the horizontal direction. On the contrary, if the priority direction in address assignment is the vertical direction, logical addresses are assigned to units in a block in the order of priority of the vertical direction.

Addresses in a unit should be sequentially assigned from the origin of the unit.

FIG. 47 is an explanatory diagram showing a method for expressing logical addresses assigned in a unit. In the example shown in FIG. 47, with setting the origin on the upper right, a logical address in the horizontal direction, X is set in the range of 0–23, and a logical address in the vertical direction, Y is set in the range of 0–3. In addition, the I/O number corresponding to this unit is set at 0.

FIG. 48 is a diagram showing concrete example of assigning logical addresses in a main layout according to the rules described above. This shows an example of using the main layout shown in FIG. 46, block layouts shown in FIGS. 45A and 45B, and unit layouts shown in FIGS. 44A and 44B, and defining the horizontal direction as the priority direction in address assignment.

By the way, there arises the following problem in case of assigning logical addresses with using the conventional editing apparatus for physical conversion definition, which is described above:

(1) A user cannot set the order of address assignment in a block layout. For example, in the block layout having a sequence number "1" in the main layout shown in FIG. 48 (the block layout on the upper left), two unit layouts arranged in the first row are sequentially given logical addresses from the nearest unit to the upper left that is the origin. Therefore, it is not possible to sequentially assign a logical address from a unit on the upper right, on the contrary. In addition, if four units are there, it is not possible to assign logical addresses to central units after assigning logical addresses to both sides of units with overjumping the central units.

Owing to this, so as to perform the assignment of logical addresses that is equivalent to this, it is necessary, for example, to generate plenty of small blocks and to exchange the sequence of logical addresses with devising respective sequence numbers. Therefore, assignment work of logical addresses becomes complicated.

(2) Block definition where logical addresses are not consecutive in a block cannot be performed.

Since assignment is performed so that the logical addresses may be consecutive in a block, for example, as shown in FIG. 49, it is not possible to assign logical addresses so that the logical addresses may become consecutive in two blocks as a whole. Therefore, so as to perform the assignment of logical addresses that is equivalent to this, it is necessary to generate plenty of small blocks including one unit or a plurality of units where logical addresses are consecutive, and to exchange the sequence of logical addresses with devising respective sequence numbers. Therefore, assignment work of logical addresses becomes complicated.

(3) Block size should be uniform. For example, the main layout shown in FIG. 50 cannot be generated.

(4) Physical conversion definition where not all the logical addresses are included cannot be generated. In general, since physical conversion is complicated and needs long processing time, logical addresses corresponding to a part of memory cells in memory may not be consecutive if the physical conversion is performed for the part of memory cells. For example, if it is attempted to generate the main layout shown in FIG. 51, logical addresses in the horizontal direction, 50-6F are not included, and hence this runs counter to the rules described above. Therefore, it is not possible to generate physical conversion definition corresponding to such a main layout.

(5) An assignment rule at the time when the size of units included in a block is not uniform is not adequate. FIG. 52 is a diagram showing a state of assigning logical addresses when the priority direction in address assignment in the main layout shown in FIG. 48 is changed to the vertical direction. Assuming that address assignment is performed according to the sequence number shown in FIG. 46, first, a logical address is assigned to the block arranged on the upper left. With watching units corresponding to the I/O number "0", logical addresses are assigned to units "a", "b", "c", and "d" in this order. In this manner, when logical addresses are assigned to four units, logical addresses in the vertical direction reach 15H that equals to the height of the block. Therefore, when the next assignment of a logical address is performed, an address in the vertical direction is assigned from the initial value after adding 1 to the last value of the logical address in horizontal direction. Therefore, logical addresses are assigned to a unit "e" included in the block on the lower right according to the sequence number.

Nevertheless, if the logical address in the horizontal direction is made to be 8 by adding 1 to the last value "7," this logical address becomes equal to the logical address assigned in the unit "a," and hence an error arises. In this manner, since combination of units whose sizes are irregular is allowed, the contradictory assignment of logical addresses may be performed.

(6) Although it is necessary to set a sequence number defining the sequence of each block before assignment of logical addresses, it is difficult to adequately set this sequence number. Therefore, a user not matured needs long setting time of the sequence number and needs to repeat assignment of logical addresses by changing sequence numbers many times, and hence complexity increases. In particular, since large capacity of memory is brought to market recently, also, the number of blocks in a main layout has the tendency of sharply increasing. Therefore, since a user needs long time for the setting work of the sequence number, the user loses his/her eager for generating the physical conversion definition.

(7) Since the origin of the physical address is fixed on the upper left, it is necessary to devise the sequence number of each block by decreasing the size of each block.

In this manner, there are problems that working efficiency decreases due to many restrictions if the physical conversion definition is generated with using the conventional method. Therefore, a method that has few restrictions and can increase working efficiency has been desired.

SUMMARY OF THE INVENTION

The present invention is created in consideration of these points and is to provide an editing apparatus and a generating method for physical conversion definition that have few restrictions and can increase working efficiency.

An editing apparatus for physical conversion definition according to a preferable embodiment of the present invention generates layouts through the following procedure. Thus, address parameter setting means specifies address parameters including information relating to the setup contents of physical addresses and logical addresses of semiconductor memory. Furthermore, layout means sets a plurality of elements whose structural unit is one memory cell or a plurality of memory cells, and specifies a logical address to each of these elements. Therefore, by directly specifying the logical address of each element included in the layout, it is possible to generate the physical conversion definition defining the relation between the physical address and logical address. Therefore, it is not necessary to perform complicated setting such as presetting of a sequence number specifying the sequence of assignment of logical addresses like a conventional apparatus. Hence, restrictions are few, and it is possible to increase working efficiency at the time when the physical conversion definition is generated.

In addition, it is preferable to construct the layouts, described above, in a hierarchical structure and to make each element included in the lowest layout correspond to a memory cell in the semiconductor memory. Usually, since correspondence of a physical address of the semiconductor memory to a logical address is repeated in many cases with making a predetermined range a unit. Hence, by generating layouts in a hierarchical structure with making this predetermined range a unit, regularity becomes clear. Therefore, since specification of each bit in a logical address becomes easy, working efficiency can be further increased. In particular, if logical addresses of a plurality of layouts that are included in the same hierarchy have the same regularity, it becomes possible to generate another layout by inverting predetermined bits in a logical address of a certain layout instead of individually generating each layout. Hence, it becomes possible to reduce workload.

In addition, it is preferable that the layout generating means described above has a function of specifying the number of elements in a layout and a function of specifying a logical address of an element, which is selected, every bit. This is because it is possible to perform generation work of the physical conversion definition by specifying the optimum number of elements every semiconductor memory since it is possible to specify an optional number of elements on the basis of the regularity of the logical addresses. Furthermore, since it is possible to specify a logical address every bit, it is possible to optionally specify the sequence of logical addresses and the like, and hence it becomes possible to further freely set logical addresses.

Moreover, it is preferable to generate layouts by the layout generating means according to predetermined rules for deciding the physical conversion definition. By performing the uniform generating work of layouts according to the predetermined rules, it is possible to increase the working efficiency and to reduce errors and the like arising at the time of performing the subsequent physical conversion.

BRIEF DESCRIPTION OF THE DRAWINGS

FIG. 8 is a diagram showing a layout in the area A shown in FIG. 7;

FIG. 9 is a diagram showing a layout in the area B shown in FIG. 7;

FIG. 10 is a diagram showing a layout in the area C shown in FIG. 7;

FIG. 11 is a diagram showing a layout in the area D shown in FIG. 7;

FIG. 20 is a diagram showing an initial state of a layout corresponding to the area E;

FIGS. 23A through 23F are diagrams showing a method for specifying a logical address of each element in the area A;

FIG. 24 is a diagram showing an initial state of a layout in the highest level;

FIGS. 25A through 25F are diagrams showing a method for specifying a logical address of each element included in the layout in the highest level;

FIG. 39 is a flowchart showing operating procedure for generating a main layout on the way of generation;

FIG. 40 includes diagrams showing a concrete example of a main layout on the way of generation;

FIG. 41 includes diagrams showing a concrete example of a main layout on the way of generation;

FIG. 48 is a diagram showing a concrete example of assigning a logical address with defining a horizontal direction as the priority direction according to a conventional assignment rule of a logical address;

FIG. 49 is a diagram showing a concrete example of a block layout in a case that logical addresses are not consecutive in a block;

FIG. 50 is a diagram showing a concrete example of a main layout of physical conversion definitions having irregular block sizes;

FIG. 51 is a diagram showing a concrete example of a main layout of physical conversion definitions including not all the logical addresses; and FIG. 52 is a diagram showing a concrete example of assigning logical addresses with defining a vertical direction as the priority direction according to conventional assignment rules of a logical address.

DESCRIPTION OF THE PREFERRED EMBODIMENT

An editing apparatus for physical conversion definition according to an embodiment of the present invention is characterized in generating physical conversion definition by directly assigning a logical address without using a sequence number. Hereinafter, the editing apparatus for physical conversion definition according to an embodiment of the present invention will be described in detail with reference to drawings.

(1) Structure of Editing Apparatus for Physical Conversion Definition

Figure 1:
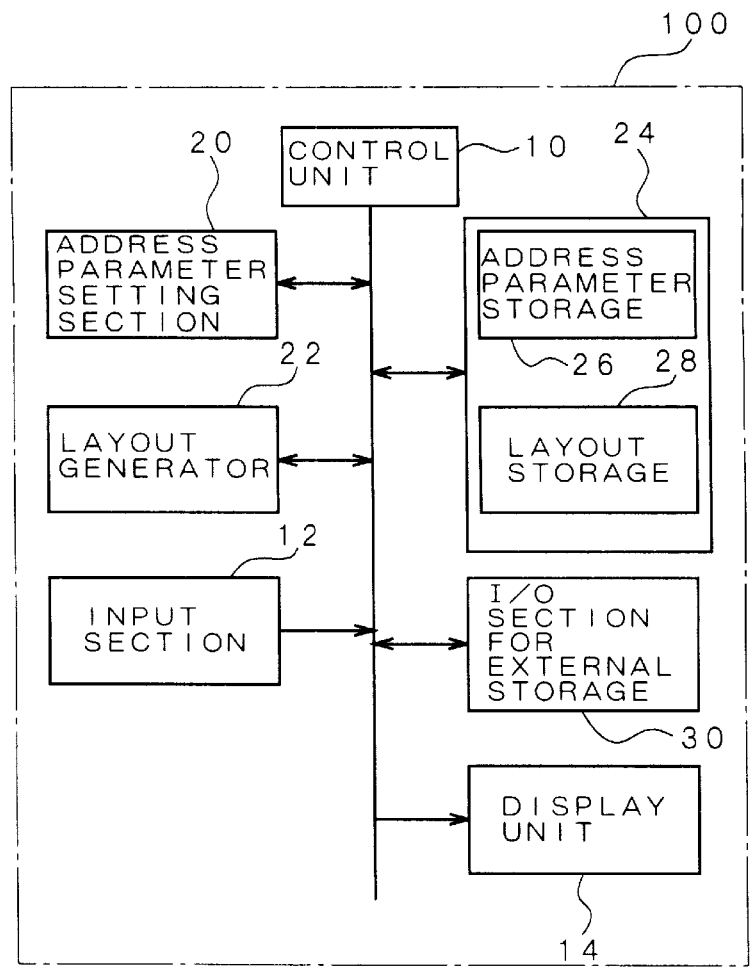
FIG. 1 is a block diagram showing the structure of an editing apparatus for physical conversion definition, which relates to this embodiment.
Figure 43:
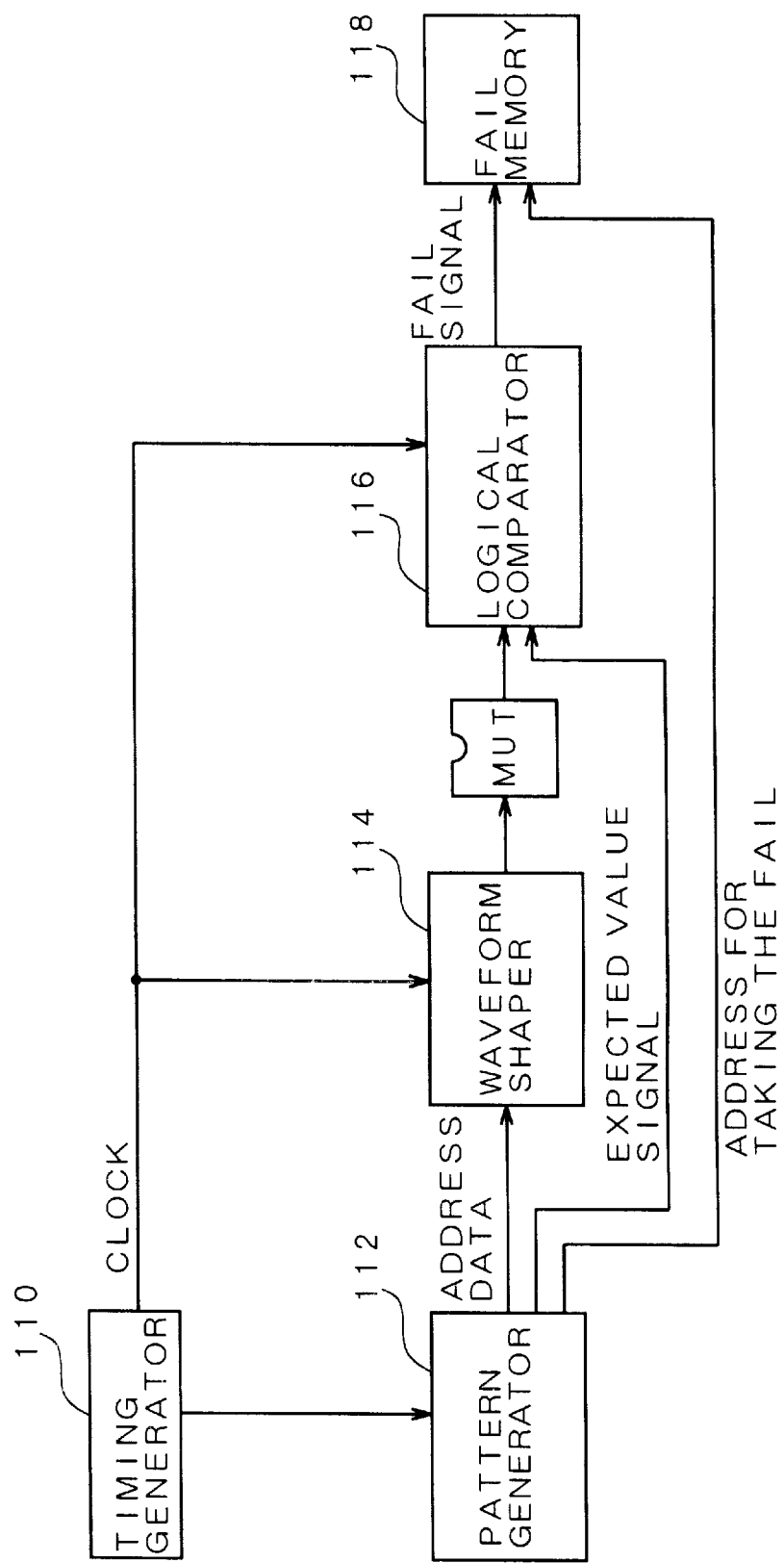
FIG. 43 is a block diagram showing the structure of a semiconductor memory test system.
Figure 44A:
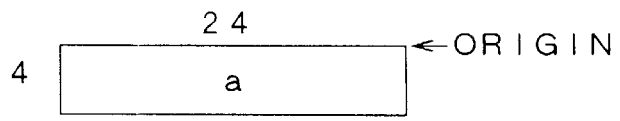
FIGS. 44A and 44B are diagrams showing concrete examples of conventional unit layouts.
Figure 44B:
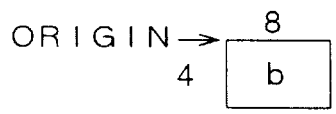
Figure 45A:
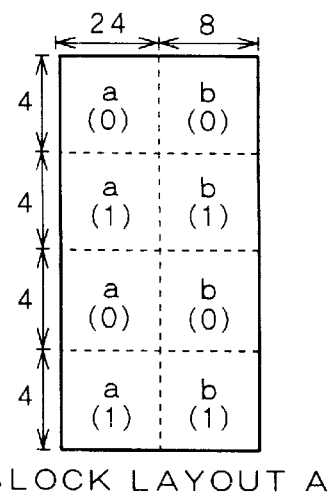
FIGS. 45A and 45B are diagrams showing concrete examples of conventional block layouts.
Figure 45B:
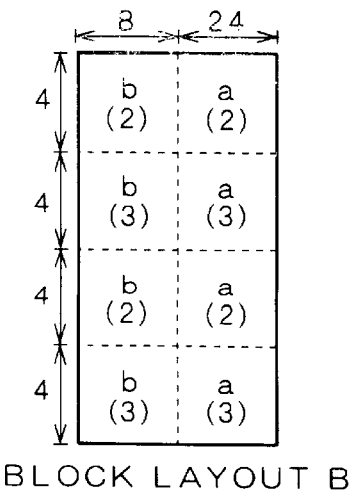
Figure 46:
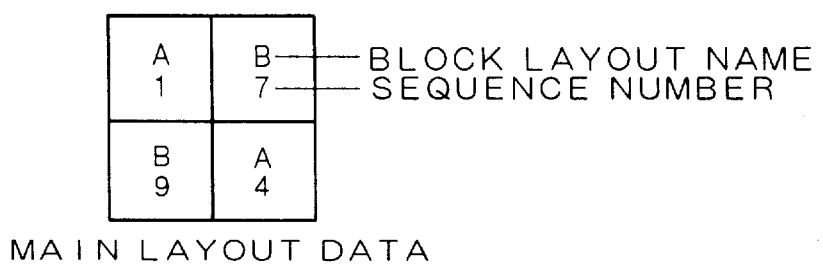
FIG. 46 is a diagram showing a concrete example of a conventional main layout.
Figure 47:
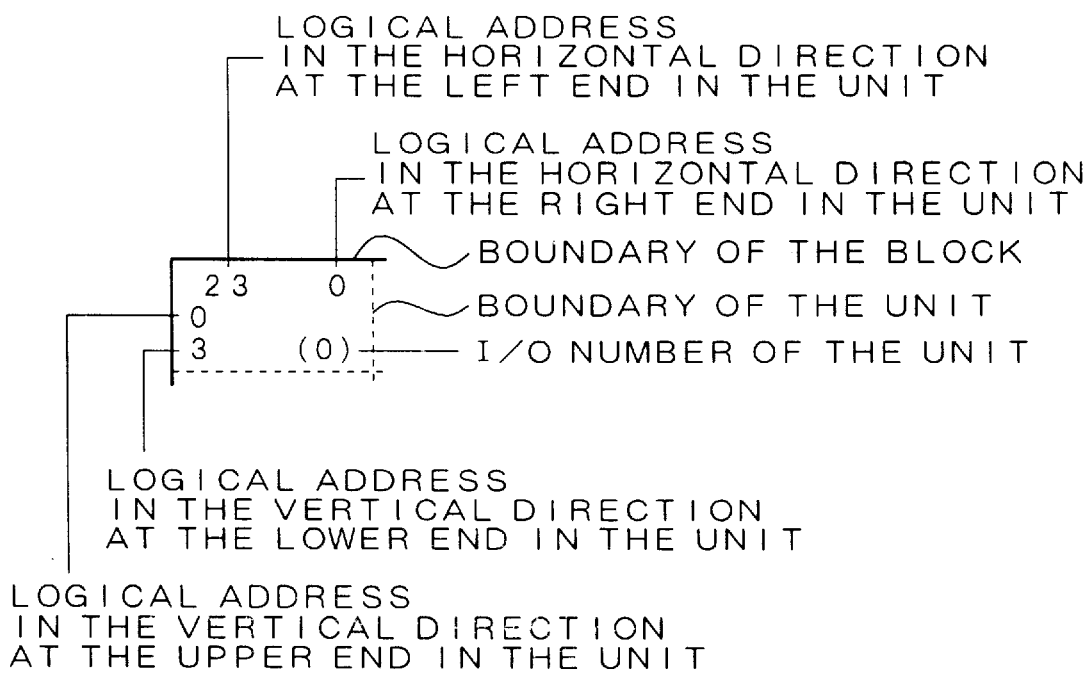
FIG. 47 is an explanatory diagram showing a method for expressing logical addresses assigned in a unit.

FIG. 1 is a block diagram showing the structure of an editing apparatus for physical conversion definition, which relates to this embodiment. This editing apparatus for physical conversion definition (hereinafter, this is simply called an "editing apparatus") 100 is an apparatus to generate physical conversion definition necessary for obtaining a physical fail bit map from a logical fail bit map that is fail information read from a fail memory 118 included in a semiconductor memory test system shown in FIG. 43. For example, this apparatus is realized by activating predetermined software with a host system connected to a semiconductor memory test system.

The editing apparatus 100 shown in FIG. 1 comprises a control unit 10, an input section 12, a display unit 14, an address parameter setting section 20, a layout generator 22, physical conversion definition storage 24, and an I/O section for external storage 30.

The control unit 10 controls the entire editing apparatus 100, and controls input and output of data between respective components, and an operating procedure. The input section 12 is used for inputting various address parameters and various operational commands relating to assignment of a logical address when the physical conversion definition is generated. This input section 12 comprises, for example, a keyboard and a mouse as a pointing device. The display unit 14 is used for displaying a generation state and generation result of the physical conversion definition, and a user performs generating work of the physical conversion definition with watching a screen of this display unit 14.

In addition, the address parameter setting section 20 shown in FIG. 1 sets various address parameters necessary for generating the physical conversion definition. The layout generator 22 generates a layout composed of arranging memory cells or different layouts in a grid-like pattern.

The physical conversion definition storage 24 includes an address parameter storage 26 and a layout storage 28. The address parameter storage 26 stores various address parameters set by the address parameter setting section 20. In addition, the layout storage 28 stores information relating to a layout generated by the layout generator 22.

The I/O section for external storage 30 stores the physical conversion definition, generated by the editing apparatus 100, in external storage such as a hard disk and reads the physical conversion definition, stored in the external storage, into editing apparatus 100.

Figure 2:
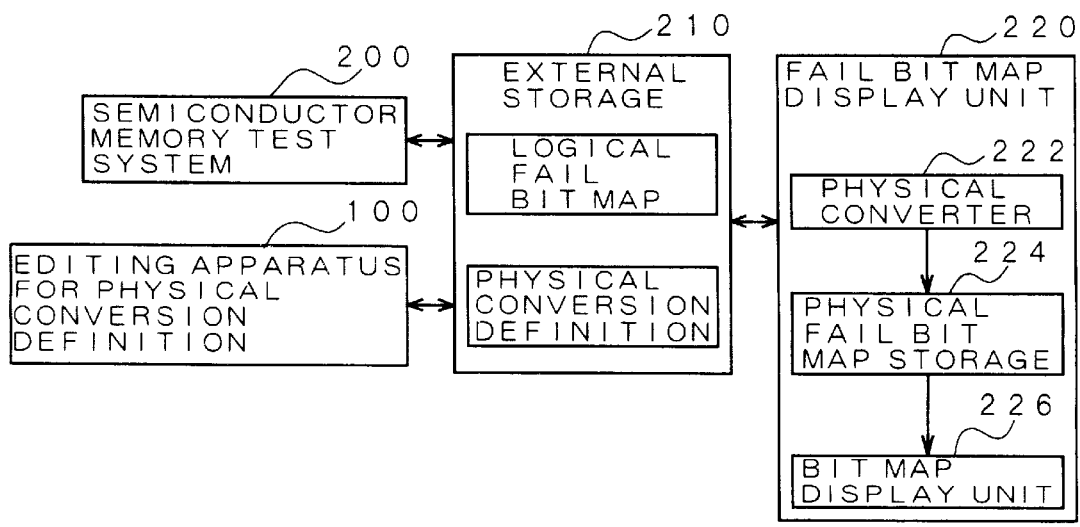
FIG. 2 is a block diagram showing relation between the editing apparatus for physical conversion definition, which relates to this embodiment, and an external storage.

FIG. 2 is a diagram showing relation between the editing apparatus 100 and external storage, and shows an example of a structure obtained by combining peripherals besides that. In FIG. 2, a semiconductor memory test system 200 performs failure analysis of semiconductor memory (not shown), and has a structure shown in FIG. 43. The external storage 210 stores a logical fail bit map read from fail memory in the semiconductor memory test system 200 and the physical conversion definition generated by the editing apparatus 100.

In addition, a fail bit map display unit 220 includes a physical converter 222, a physical fail bit map storage 224, and a bit map display unit 226. Furthermore, the fail bit map display unit 220 displays a physical fail bit map on the basis of the logical fail bit map and physical conversion definition that are stored in the external storage 210. The physical converter 222 converts the logical fail bit map into a physical fail bit map on the basis of the physical conversion definition and stores the physical fail bit map in the physical fail bit map storage 224. The bit map display unit 226 displays contents of the physical fail bit map stored in the physical fail bit map storage 224.

(2) Operation of Editing Apparatus for Physical Conversion Definition

Next, the generating operation of physical conversion definition by the editing apparatus 100 described above will be described.

(2-1) Operation of Address Parameter Setting Section

Typical address parameters set by the address parameter setting section 20 are:

1) Axes and origin of a physical address
2) Number of bits of a logical address

As for setting of axes of a physical address, there are a case that the horizontal direction is X and the vertical direction is Y and a case that the horizontal direction is Y and the vertical direction is X. In addition, as the origin of the physical address, any one of the upper left, upper right, lower left, and lower right is specified. FIGS. 3A through 3H are graphs showing concrete contents of address parameters for specifying the axes and origin of a physical address. In each of the graphs, the position specified by a symbol "▲" shows the origin, a symbol "X" shows the X-axis of the physical address, and a symbol "Y" shows the Y-axis the physical address. As address parameters relating to the "axes and origin of the physical address," any one of eight kinds of combinations shown in FIGS. 3A to 3H is selected. In addition, the specification of the axes and origin can be performed at any stage in a period of generating the physical conversion definition.

In addition, as for setting of the number of bits of a logical address, the numbers of bits of an I/O number, a logical address "X", a logical address "Y", and a logical address "Z" are set. For example, if the numbers of bits of the I/O number, logical address "X," logical address "Y," and logical address Z are set at "4," "10," "8," and "0" respectively, respective value ranges become 0–15, 0–1023, 0–255, and 0. In addition, respective numbers of bits of the I/O number and each logical address are set at "0."

Setting of the number of bits of the logical address described above is to decide the upper limit of the logical address and should be performed first when the physical conversion definition is generated. In addition, the physical conversion definition generated need include not all the logical addresses specified here. For example, if the number of bits of the I/O number is set at "4," it is possible to specify a value range within 0–15 as the I/O number. Nevertheless, it is allowable to use only the value range of 0–7 or to use only the even numbers within 0–15.

Address parameters relating to item 1) Axes and origin of a physical address and item 2) Number of bits of a logical address that are set in this manner are stored in the address parameter storage 26 in the physical conversion definition storage 24.

(2-2) Operation of Layout Generator

In a layout generated by the layout generator 22, the following information is included:

Name for identifying the layout (hereinafter, this is called a "layout name")

Numbers of elements in the horizontal and vertical directions that construct the layout Logical address of each of elements constructing the layout Each layout name if each of elements constructing the layout is a different layout In addition, so as to generate such a layout, the layout generator 22 has the following functions:

Function of specifying the number of elements constructing the layout

Figure 4:
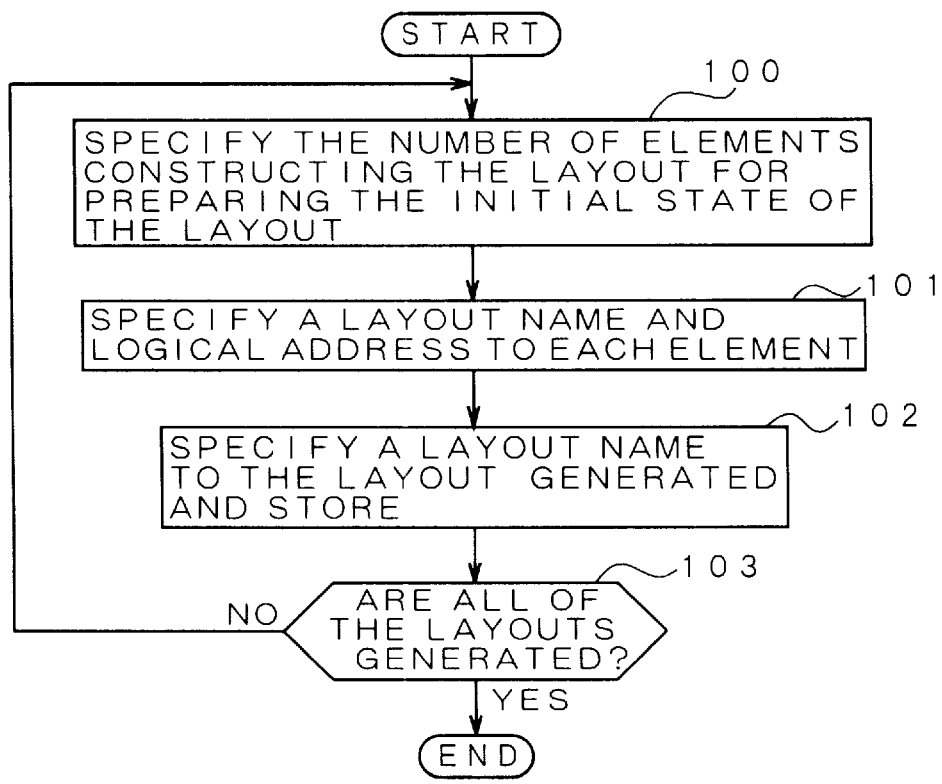
FIG. 4 is a flow chart showing operating procedure of layout generation by a layout generator.

Element selecting Function capable of easily selecting an element to be selected Function of specifying a layout name to the element selected Function of specifying a logical address every bit to the element selected Function of confirming a layout name and a logical address that are specified to each element FIG. 4 is a flow chart showing the operating procedure for layout generation by the layout generator 22. First, the layout generator 22 specifies the number of elements constructing the layout for preparing the initial state of the layout (step 100).

Figure 5:
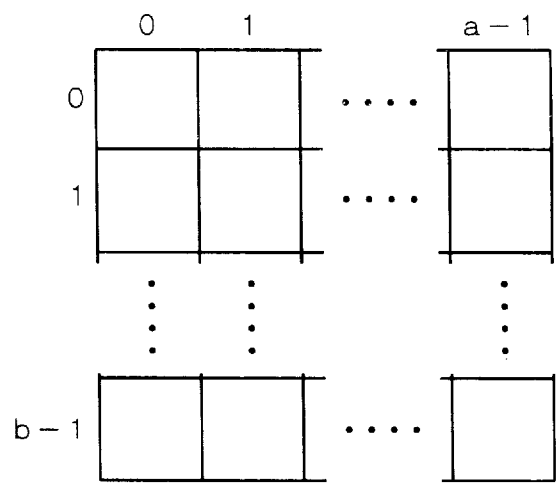
FIG. 5 is a diagram showing an initial state of layout.

FIG. 5 is a diagram showing the initial state of the layout. As shown in FIG. 5, the layout in the initial state where a×b elements having the number of elements "a" in the horizontal direction and the number of elements "b" in the vertical direction are arranged in a grid-like pattern is prepared. In addition, regarding the layout shown in FIG. 5, numbers "0" through "a−1" corresponding to respective elements arranged in the horizontal direction show the index numbers in the horizontal direction, and numbers "0" through "b−1" corresponding to respective elements arranged in the vertical direction show the index numbers in the vertical direction. It is assumed that the position of the origin of these index numbers is on the upper left and, for example, the element (0, 0) shows the element on the upper left, and the element (a−1, b−1) shows the element on the lower right.

In the layout in the initial state that is described above, a logical address of each element is 0, and a layout name of each element is not specified.

Next, the layout generator 22 specifies a layout name and a logical address to each element of the layout generated, if necessary (step 101). Furthermore, the layout generator 22 specifies a layout name to the layout generated, and stores the layout in the layout storage 28 in the physical conversion definition storage 24 (step 102). Such generating operation of a layout is repeated until all the layouts are generated (step 103).

(2-3) Rules for Deciding Physical Conversion Definition

Although the editing apparatus 100 of this embodiment can generates physical conversion definition by setting of address parameters and generation of the physical conversion definition that are described above, the following rules are applied at the time of generation.

(Rule 1)

An element whose layout name is not specified is a memory cell.

(Rule 2)

An element whose layout name is specified can be developed with layouts identified by layout names. If a layout name not existing is specified, an error arises at the time of physical conversion performed by the physical converter 222 shown in FIG. 2.

(Rule 3)

It is allowable that a layout has a hierarchic structure (nesting) in several levels. It is preferable that at least two levels of nesting is allowable. In addition, recursive nesting causes an error at the time of physical conversion. A recursive nesting that causes an error is, for example, a nesting that a layout name "b" is specified to any one of elements constructing a layout having a layout name "a" and the layout name "a" is specified to any one of elements constructing a layout having the layout name "b."

(Rule 4)

When an element (m, n) in a layout is developed in another layout into a memory cell. Exclusive-OR operation should be performed between a logical address of each memory cell and the logical address specified to the element (m, n).

(Rule 5)

In regard to each element of a layout, elements having the same index number in the horizontal direction should have the same number of memory cells in the horizontal direction. Furthermore, elements having the same index number in the vertical direction should have the same number of memory cells in the vertical direction. If these conditions are fulfilled, it is not necessary that respective elements of the layout have the same size, and it is allowable that elements whose layout names are specified mix with elements whose layout names are not specified.

Figure 6A:
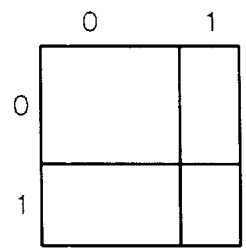
FIGS. 6A through 6C are diagrams showing relation between respective numbers of elements in the horizontal and vertical directions.
Figure 6B:
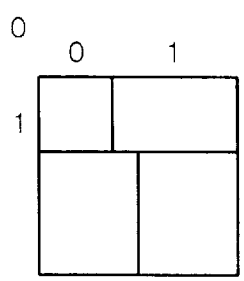
Figure 6C:
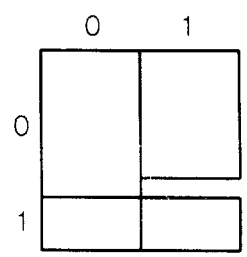

FIGS. 6A through 6C are diagrams showing relation between the numbers of elements in horizontal and vertical directions. As shown in FIG. 6A, two elements (0, 0) and (0, 1) in the vertical direction each of which has an index number 0 in the horizontal direction have the same size in the horizontal direction. Two elements (1, 0) and (1, 1) each of which has an index number 1 in the horizontal direction have the same size in the horizontal direction similarly to the above. In addition, two elements (0, 0) and (1, 0) each of which has an index number 0 in the vertical direction have the same size in the vertical direction. Two elements (0, 1) and (1, 1) each of which has an index number 1 in the vertical direction have the same size in the vertical direction similarly to the above. On the contrary, in FIG. 6B, elements arranged in the vertical direction each of which has an index number 0 or 1 respectively in the horizontal direction have not the same size in the horizontal direction. In addition, in FIG. 6C, two elements each of which has an index number 0 in the vertical direction have not the same size in the vertical direction. In this manner, examples shown in FIGS. 6B and 6C violate the rule 5 described above since respective elements arranged in the vertical direction have not the same size in the horizontal direction or respective elements arranged in the horizontal direction have not the same size in the vertical direction.

(Rule 6)

The layout name of the layout in the highest level is "main." If the layout named "main" does not exist, an error arises at the time of physical conversion. In addition, the layout name "main" is an example, another layout name corresponding to the layout in the highest level can be specified.

Setting of address parameters and generation of layouts are performed so that these rules 1 through 6 may be fulfilled.

(2-4) Concrete Example of Physical Conversion Definition

Next, a concrete example of physical conversion definition that becomes an object of generation will be described.

FIGS. 7 through 15 are diagrams showing the concrete example of the physical conversion definition to be generated from now. In addition, it is assumed that each number after x?, y?, and d? shows each bit of logical addresses X, Y, and I/O number denoted by ?.

Figure 7:
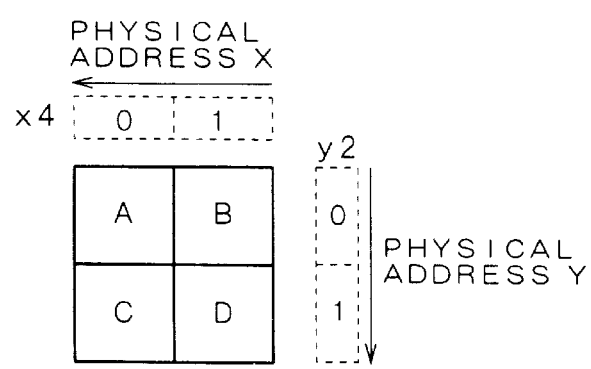
FIG. 7 is a diagram showing a layout in the highest level in physical conversion definition.

FIG. 7 is a diagram showing the entire structure of the physical conversion definition (the layout in the highest level). As shown in FIG. 7, the entire physical conversion definition is composed of four areas A, B, C, and D. In the area A, x4 is set at 0, and y2 is at 0. In the area B, x4 is set at 1, and y2 is at 0. In the area C, x4 is set at 0, and y2 is at 1. In the area D, x4 is set at 1, and y2 is at 1.

FIG. 8 is a diagram showing the structure of the area A shown in FIG. 7. As shown in FIG. 8, the area A includes 16 areas specified by combining 4 bits in total, that is, d0, d1, x5, and y3, and is classified into two kinds of areas E and F as a total.

FIG. 9 is a diagram showing the structure of the area B shown in FIG. 7. As shown in FIG. 9, the area B also includes 16 areas that are specified by combining 4 bits in total, that is, d0, d1, x5, and y3 and is composed of two kinds of areas E and F. This area B can be obtained by inverting y3 in the area A.

FIG. 10 is a diagram showing the structure of the area C shown in FIG. 7. As shown in FIG. 10, the area C includes 16 areas that are specified by combining 4 bits in total, that is, d0, d1, x5, and y3 and is composed of two kinds of areas G and H. The areas G and H can be obtained by inverting y0 and y1 in the areas E and F as described later. Furthermore, the entire area C can be obtained by inverting x5, y0, y1, y3, and d1 in the area A.

FIG. 11 is a diagram showing the structure of the area D shown in FIG. 7. As shown in FIG. 11, the area D, similarly to the area C, includes 16 areas that is composed of two kinds of areas G and H. Furthermore, the entire area D can be obtained by inverting x5, y0, y1, and d1 in the area A.

Figure 12:
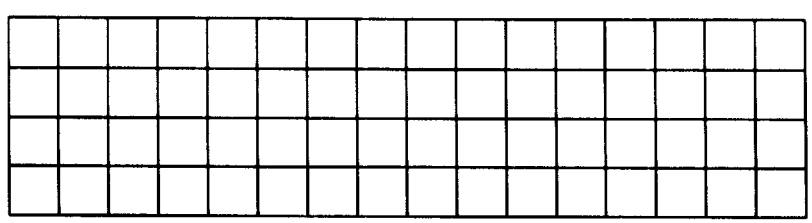
FIG. 12 is a diagram showing a layout in the area E shown in FIGS. 8 and 9.

FIG. 12 is a diagram showing the detailed structure of the area E shown in FIGS. 8 and 9. As shown in FIG. 12, the area E includes 64 memory cells that are specified by combining 6 bits in total, that is, x0–x3, y0, and y1.

Figure 13:
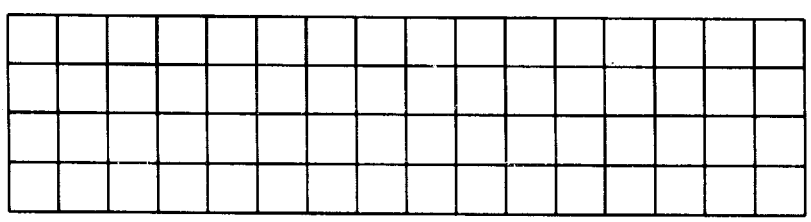
FIG. 13 is a diagram showing a layout in the area F shown in FIGS. 8 and 9.

FIG. 13 is a diagram showing the detailed structure of the area F shown in FIGS. 8 and 9. As shown in FIG. 13, the area F, similarly to the area E, includes 64 memory cells that are specified by combining 6 bits in total, that is, x0–x3, y0, and y1. The area F can be obtained by inverting x0, x1, x2, and x3 in the area E.

Figure 14:
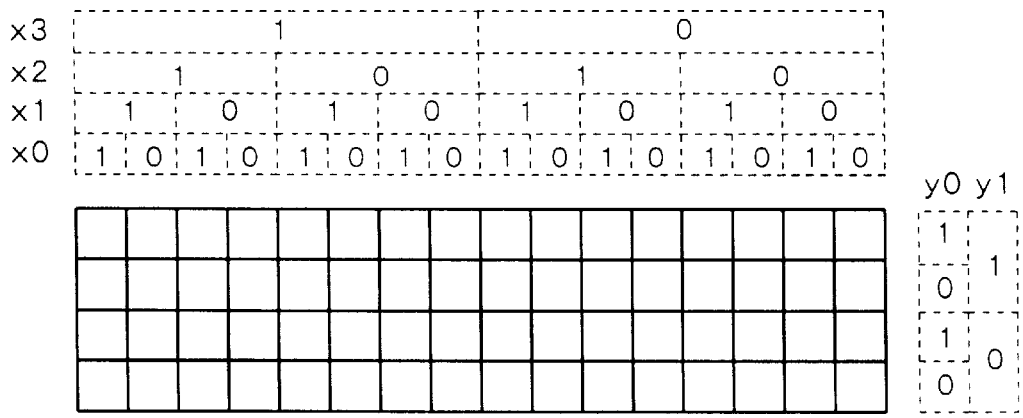
FIG. 14 is a diagram showing a layout in the area G shown in FIGS. 10 and 11.

FIG. 14 is a diagram showing the detailed structure of the area G shown in FIGS. 10 and 11. As shown in FIG. 14, the area G, similarly to the area E, includes 64 memory cells that are specified by combining 6 bits in total, that is, x0–x3, y0, and y1. The area G can be obtained by inverting y0 and y1 in the area E.

Figure 15:
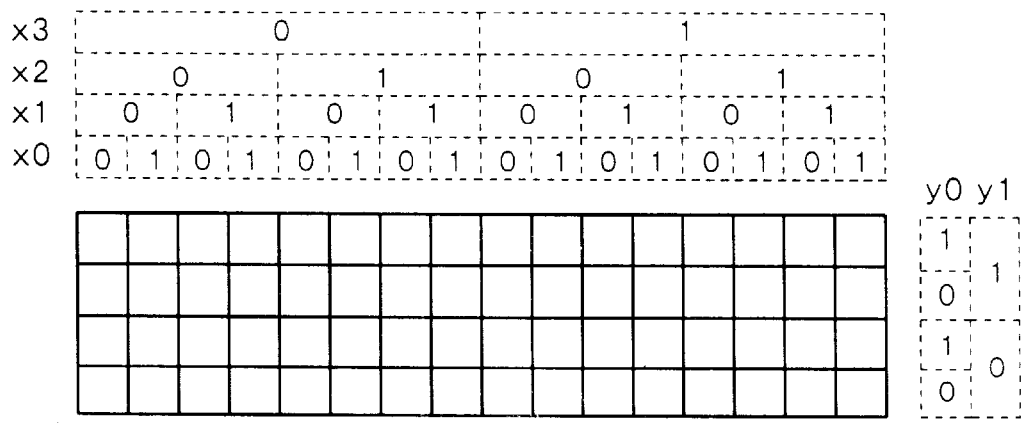
FIG. 15 is a diagram showing a layout in the area H shown in FIGS. 10 and 11.

FIG. 15 is a diagram showing the detailed structure of the area H shown in FIGS. 10 and 11. As shown in FIG. 15, the area H, similarly to the area E, includes 64 memory cells that are specified by combining 6 bits in total, that is, x0–x3, y0, and y1. The area H can be obtained by inverting x0–x3, y0, and y1 in the area E.

Figures 16, 17:
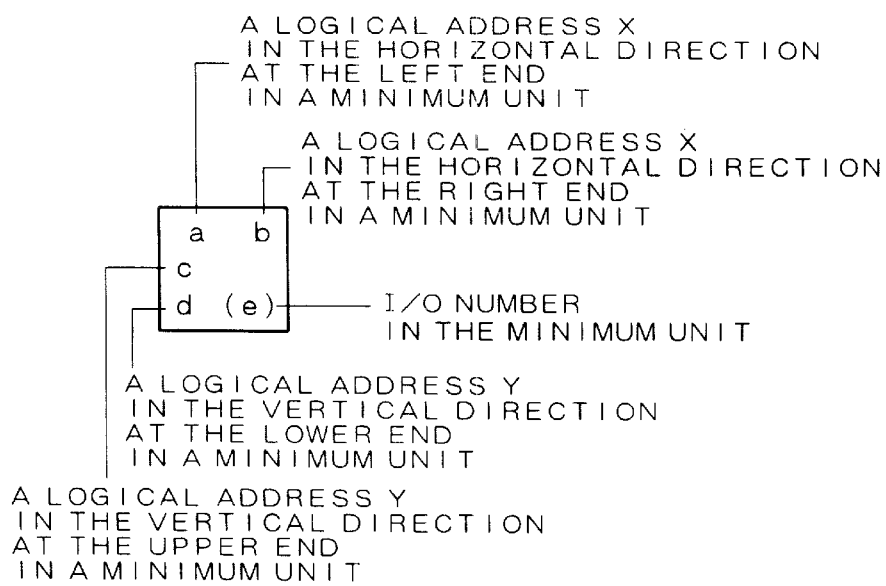
FIG. 16 is a diagram showing physical conversion definition, which is shown with using FIGS. 7 through 15, in different expression.
FIG. 17 is an explanatory diagram of a grid-like area that is a minimum unit of the physical conversion definition shown in FIG. 16.

FIG. 16 is a diagram showing the physical conversion definition, detailed-contents of which are shown in FIGS. 7 through 15 described above, in different expression. In FIG. 16, each box divided into grid-like areas shows a minimum unit where logical addresses X and Y are consecutive and I/O numbers are the same. As shown in FIG. 17, a logical address X, "a" at the left end and a logical address X, "b" at the right end in a minimum unit are aligned in the horizontal direction in each box. Furthermore, a logical address Y, "c" at the upper end and a logical address Y, "d" at the lower end in a minimum unit are aligned in the vertical direction. Moreover, in each box, an I/O number "e" in the minimum unit is included.

(2-15) Concrete Generating Operation of Physical Conversion Definition

Next, the concrete operation of generating the physical conversion definition shown in FIG. 16.

Figure 18:
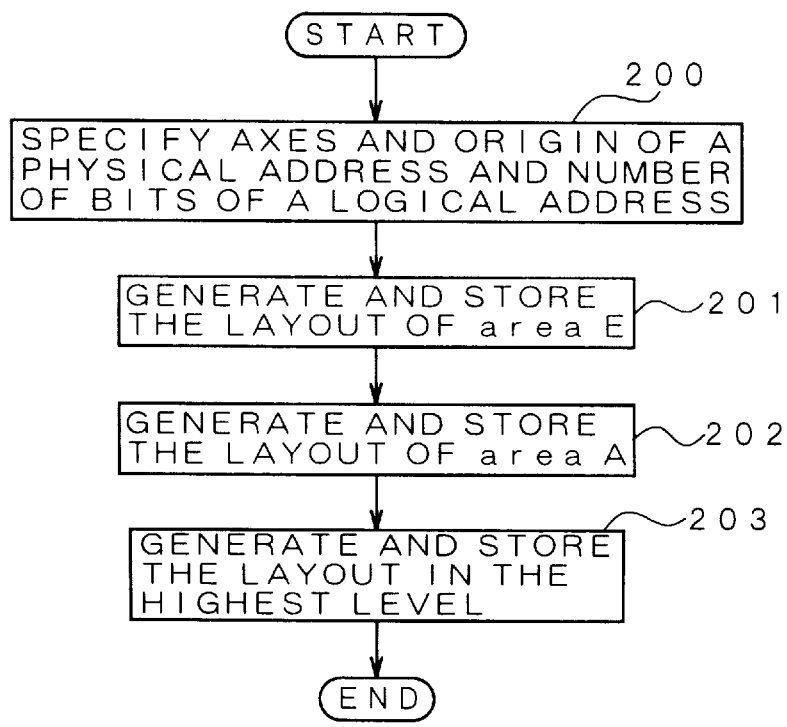
FIG. 18 is a flow chart showing concrete operating procedure for generating the physical conversion definition shown in FIG. 16.

FIG. 18 is a flow chart showing the operating procedure for generating the physical conversion definition, shown in FIG. 16, by the editing apparatus 100. First, the address parameter setting section 20 sets the following parameters (step 200):

1) Axes and origin of a physical address
2) Number of bits of a logical address

Figure 3A:
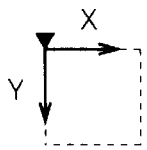
FIGS. 3A through 3H are graphs showing concrete contents of address parameters each specifying axes and an origin of a physical address.
Figure 3B:
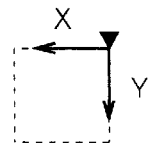
Figure 3C:
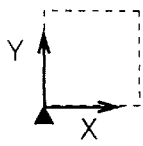
Figure 3D:
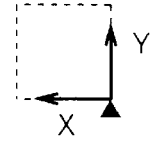
Figure 3E:
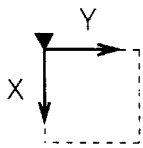
Figure 3F:
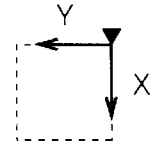
Figure 3G:
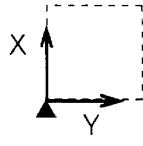
Figure 3H:
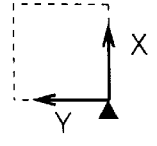

Concretely, combination shown in FIG. 3B is selected as the axes and origin of the physical address, and the numbers of bits of logical addresses are set as follows:

Number of bits of I/O number: 2
Number of bits of logical address X: 6
Number of bits of logical address Y: 4
Number of bits of logical address Z: 0

In addition, as described above, it can be performed at any stage in a period of generating the physical conversion definition to specify the axes and origin of the physical address as address parameters.

Next, the layout generator 22 generates the layout of the area E shown in FIG. 12, and stores the layout in the layout storage 28 in the physical conversion definition storage 24 (step 201).

Figure 19:
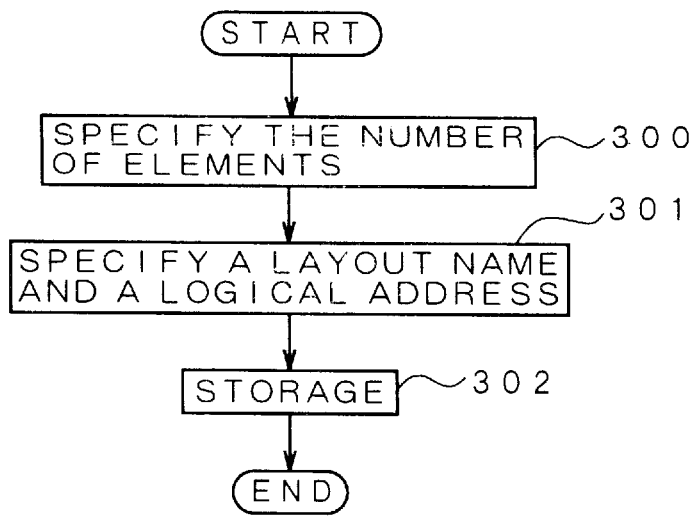
FIG. 19 is a flow chart showing detailed operating procedure for generating a layout.

FIG. 19 is a flow chart showing the detailed operating procedure for generating a layout. First, the layout generator 22 specifies the number of elements of an area to be generated (step 300). As for the area E, the number of elements in the horizontal direction is set at 16, and the number of elements in the vertical direction is at 4. Owing to this specification, a layout in the initial state that has 16×4 elements and is shown in FIG. 20 is prepared. In this initial state, no layout name is specified to all the elements, and zero is specified to respective bits d0, d1, x0–x5, and y0–y3 of logical addresses of all the elements.

Next, the layout generator 22 specifies a layout name and a logical address of each element included in the layout in the initial state (step 301). In addition, since each element of the area E is a memory cell and not a layout, specification of layout name to each element is not performed at the time of generating the layout of the area E. FIGS. 21A through 21F are diagrams showing a method for specifying a logical address of each element in the area E. In FIGS. 21A through 21F, hatched elements correspond to the elements selected.

Figure 21A:
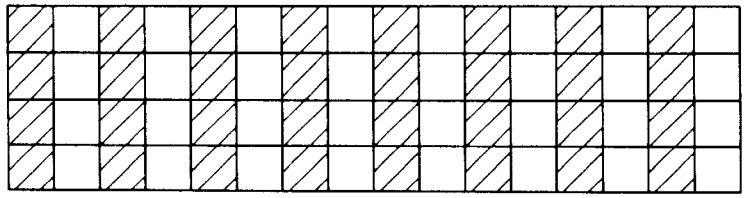
FIGS. 21A through 21F are diagrams showing a method for specifying a logical address of each element in the area E.
Figure 21B:
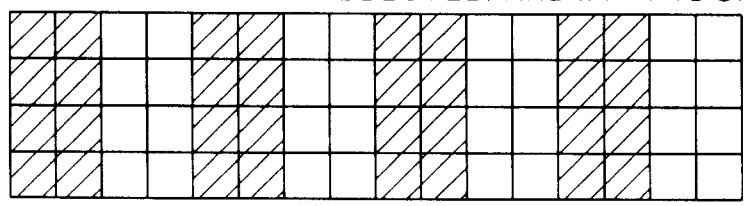
Figure 21C:
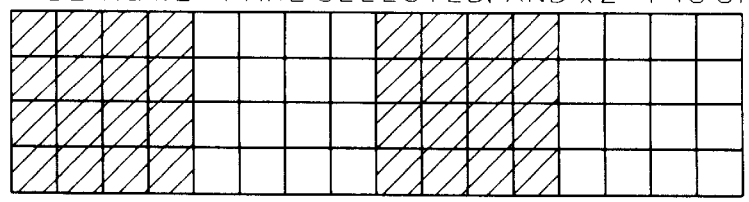
Figure 21D:
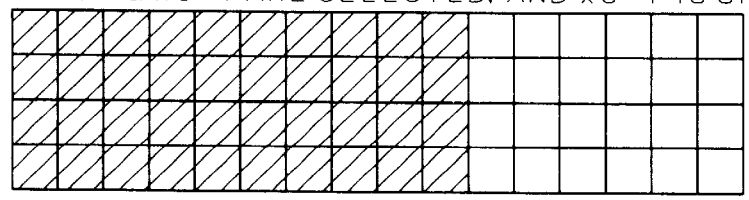
Figure 21E:
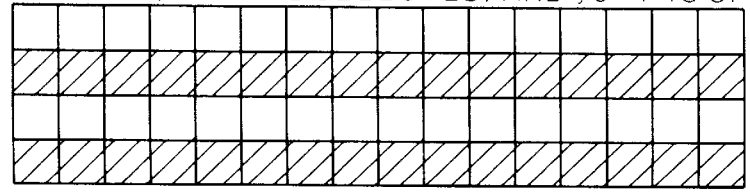
Figure 21F:
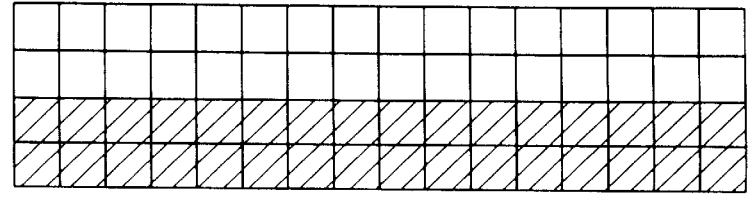

First, elements being x0=1 are selected, and x0=1 is specified (FIG. 21A). Next, elements being x1=1 are selected, and x1=1 is specified (FIG. 21B). Similarly, elements being x2=1 are selected, and x2=1 is specified (FIG. 21C). Elements being x3=1 are selected, and x3=1 is specified (FIG. 21D). Elements being y0=1 are selected, and y0=1 is specified (FIG. 21E). Elements being y1=1 are selected, and y1=1 is specified (FIG. 21F).

In addition, the specification sequence of respective bits x0, x1, x2, x3, y0, and y1 of logical addresses described above is optional, and hence any sequence is allowable. In addition, respective residual bits d0, d1, x4, x5, y2, and y3 of the logical addresses not specified are zero as they are in the initial state.

Next, the layout generator 22 specifies a layout name to the layout generated, and stores the layout in the layout storage 28 (step 302). For example, the layout generated in regard to the area E is named "sub block" and is stored.

In this manner, the layout in regard to the area E is generated and is stored in the layout storage 28.

Further, the layout generator 22 generates a layout of the area A shown in FIG. 8, and stores the layout in the layout storage 28 in the physical conversion definition storage 24 (step 202).

The basic generating procedure is the same as the layout generating procedure of the area E that is described above, and the layout of the area A is generated according to the operating procedure shown in FIG. 19.

Figure 22:
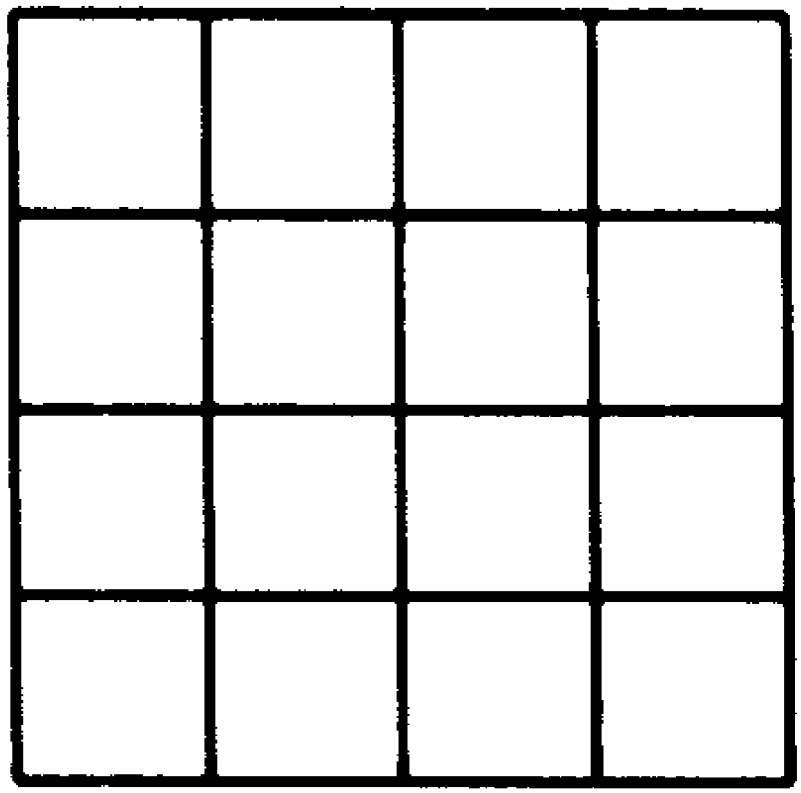
FIG. 22 is diagram showing an initial state of a layout corresponding to the area A.

First, the layout generator 22 specifies the number of elements of the area A to be generated (step 300). As for the area A, the number of elements in the horizontal direction is set at 4, and the number of elements in the vertical direction is at 4. Owing to this specification, a layout in the initial state that has 4×4 elements and is shown in FIG. 22 is prepared.

Next, the layout generator 22 specifies a layout name and a logical address of each element included in the layout in the initial state (step 301). FIGS. 23A through 23F are diagrams showing a method for specifying a logical address of each element in the area A.

First, all elements are selected, and "sub block" is specified as the layout name (FIG. 23A). Next, elements corresponding to the area F are selected, and x0=1, x1=1, x2=1, and x3=1 are specified (FIG. 23B). It is specified that the elements selected here correspond to the area F by obtaining an exclusive OR between the logical addresses specified (x0–x3) and logical addresses specified by each elements of the layout "sub block."

Next, elements being y3=1 are selected, and y3=1 is specified (FIG. 23C). Similarly, elements being d1=1 are selected, and d1=1 is specified (FIG. 22D). Elements being x5=1 are selected, and x5=1 is specified (FIG. 23E). Elements being d0=1 are selected, and d0=1 is specified (FIG. 23F).

In addition, the specification sequence of respective bits d0, d1, x0–x3, x5, and y3 of logical addresses described above is optional, and hence any sequence is; allowable. In addition, respective residual bits x4, y0, y1, and y2 of the logical addresses not specified are zero as they are in the initial state.

Next, the layout generator 22 specifies a layout name to the layout generated, and stores the layout in the layout storage 28 (step 302). For example, the layout generated in regard to the area A is named "block" and is stored.

In this manner, the layout in regard to the area A is generated and is stored in the layout storage 28.

Further, the layout generator 22 generates the layout in the highest level shown in FIG. 7, and stores the layout in the layout storage 28 in the physical conversion definition storage 24 (step 203).

The basic generating procedure is the same as the layout generating procedures of the areas E and A that are described above, and the layout in the highest level is generated according to the operating procedure shown in FIG. 19.

First, the layout generator 22 specifies the number of elements of the layout in the highest level to be generated (step 300). As for the layout in the highest level, the number of elements in the horizontal direction is set at 2, and the number of elements in the vertical direction is at 2. Owing to this specification, a layout in the initial state that has 2×2 elements and is shown in FIG. 24 is prepared.

Next, the layout generator 22 specifies a layout name and a logical address of each element included in the layout in the initial state (step 301). FIGS. 25A through 25F are diagrams showing a method for specifying a logical address of each element in the highest level.

First, all elements are selected, and "block" is specified as the layout name (FIG. 25A). Next, elements corresponding to the area B are selected, and y3=1 are specified (FIG. 25B). It is specified that the elements selected here correspond to the area B by obtaining an exclusive OR between the logical address specified (y3) and logical address specified by each element of the layout "block."

Similarly, elements corresponding to the area C are selected, and x5=1, y0=1, y1=1, y3=1, and d1=1 are specified (FIG. 25C). It is specified that the elements selected here correspond to the area C by obtaining an exclusive OR between the logical address specified (x5, y0, y1, y3, and d1) and logical address specified by each element of the layout "block."

In addition, elements corresponding to the area D, and x5=1, y0=1, y1=1, and d1=1 are specified (FIG. 25D). It is specified that the elements selected here correspond to the area D by obtaining an exclusive OR between the logical address specified (x5, y0, y1, and d1) and logical address specified by each element of the layout "block."

Next, elements being x4=1 are selected, and x4 =1 is specified (FIG. 25E). In addition, elements being y2=1 are selected, and y2=1 is specified (FIG. 25F).

In addition, the specification sequence of respective bits d1, x4, x5, and y0–y3 of logical addresses described above is optional, and hence any sequence is allowable. In addition, respective residual bits d0 and x0–x3 of the logical addresses not specified are zero as they are in the initial state.

Next, the layout generator 22 specifies a layout name to the layout generated, and stores the layout in the layout storage 28 (step 302). The layout in the highest level is named "main" and is stored.

As described above, first, address parameters are set (step 200 in FIG. 18). Then, three kinds of layouts having a hierarchical structure, that is, "sub block," "block," and "main" are generated on the basis of these address parameters (steps 201–203 in FIG. 18). Owing to this, the entire physical conversion definition is decided.

In this manner, the editing apparatus 100 according to this embodiment can decide the physical conversion definition by generating layouts having a hierarchical structure in one or a plurality of levels after setting address parameters. Therefore, restrictions are few in comparison with the case that logical address is sequentially assigned according to the sequence of the sequence number assigned to each block, and hence working efficiency can be increased. In addition, it is possible to obtain another layout by inverting values through performing exclusive OR operation to a specific bit of a logical address of this layout after generating any layout in the same level at the time of generating the layout. Therefore, it is possible to reduce the number of layouts to be generated, and to reduce processing-volume necessary for generating the physical conversion definition. In actual memory, logical addresses in a certain area can be frequently represented by inverting a part of bits of logical addresses in another bits. Therefore, it is possible to reduce the number of layouts to be generated by performing exclusive OR operation of the logical addresses.

In particular, the physical conversion definition of this embodiment is generated with freely setting a logical address of each element of layouts having a hierarchical structure in one level or a plurality of levels without fixed concept such as a main layout and a block layout like conventional physical conversion definition. Therefore, there are not these restrictions based on a position of an origin and sequence of address assignment and restrictions caused by using a sequence number, and hence it is possible to make it further free to generate the physical conversion definition.

In addition, in the above embodiment, the physical conversion definition is generated by not only generating three kinds of layouts, that is, the area in the highest level, and areas A and E, but also inverting a part of bits of logical addresses in the areas A and E. Nevertheless, the physical conversion definition can be generated by generating nine kinds of layouts, that is, the area in the highest level, and areas A through H. In this case, since each bit of each logical address of the areas A through H is directly specified, it is not necessary to perform processing of inverting a part of bits of logical addresses in the areas A and E.

In addition, although, in the above embodiment, nesting in two levels is used so as to generate the physical conversion definition, it is possible to freely set this number of levels. For example, although the layout in the lowest level having 16×4 elements is generated so as to express the area E, the area E can be generated by specifying the layout in the lowest level having 4×4 elements as each element of the layout that is in the level immediately higher than the lowest level and has 4×1 elements. In this case, since levels increase by one, nesting in three levels is used.

In addition, the generating sequence of three layouts described above, that is, "sub block," "block," and "main" is optional, and hence layouts can be generated in the sequence of, for example, "main," "block," and "sub block."

(3) Operation of Editing Apparatus for Physical Conversion Definition (Modified Example)

By the way, in the generation of the physical conversion definition by the editing apparatus 100 that is described above, the number of levels of layouts can be freely set. Furthermore, it is possible to optionally set which bits of the logical addresses X, Y, and Z, and I/O number are made to correspond to logical addresses of a layout in each level. Nevertheless, restrictions can be added for the purpose of simplification and acceleration of physical conversion processing. For example, generation of the physical conversion definition can be performed by adding restrictions as follows:

(Restriction 1) Restriction of Specifiable Logical Addresses

The logical address Z cannot be defined and is fixed to zero.

(Restriction 2) Restriction of Number of Nesting Levels

Nesting in two levels should be always performed as follows.

The layout in the highest level is called a main layout, but is not named "main."

An element constructing the main layout is called a block (corresponding to the second area).

A layout to be specified as a block is selected from a layout group called a block layout.

An element constructing the block layout is called a unit (corresponding to the first area).

A layout to be specified as a unit is selected from a layout group called a unit layout.

The unit layout is a layout in the lowest level and is composed of memory cells.

(Restriction 3) Restriction of Unit Layout

An I/O number cannot be specified to each element of a unit layout, but is fixed to 0.

In a unit layout, logical addresses X and Y are consecutive.

It is common in one definition whether logical addresses X and Y in a unit layout are consecutive in the horizontal direction or in the vertical direction. This is decided by specifying the axes of logical addresses in the unit with the address parameter setting section.

The size of a unit layout is common in one definition, and this size is decided by specifying the number of bits of each low-order address of logical addresses X and Y with the address parameter setting section.

According to the above restrictions of a unit layout, only four kinds of layouts each having an origin of logical addresses different from each other are there as unit layouts. Therefore, actual layout generation is omitted, and an origin is specified instead of specifying a unit layout name to each element of a block layout.

(Restriction 4) Restriction of Block Layout

In a block layout, a low-order address of each element cannot be specified, but is fixed to zero.

(Restriction 5) Restriction of Main Layout

In a main layout, an I/O number of each element cannot be specified, but is fixed to zero. In addition, a low-order address of each element of the main layout cannot be specified, but is fixed to zero.

These restrictions are added to the editing apparatus 100 described above, and the rules for deciding the physical conversion definition that is described above are applied as it is.

Figure 26:
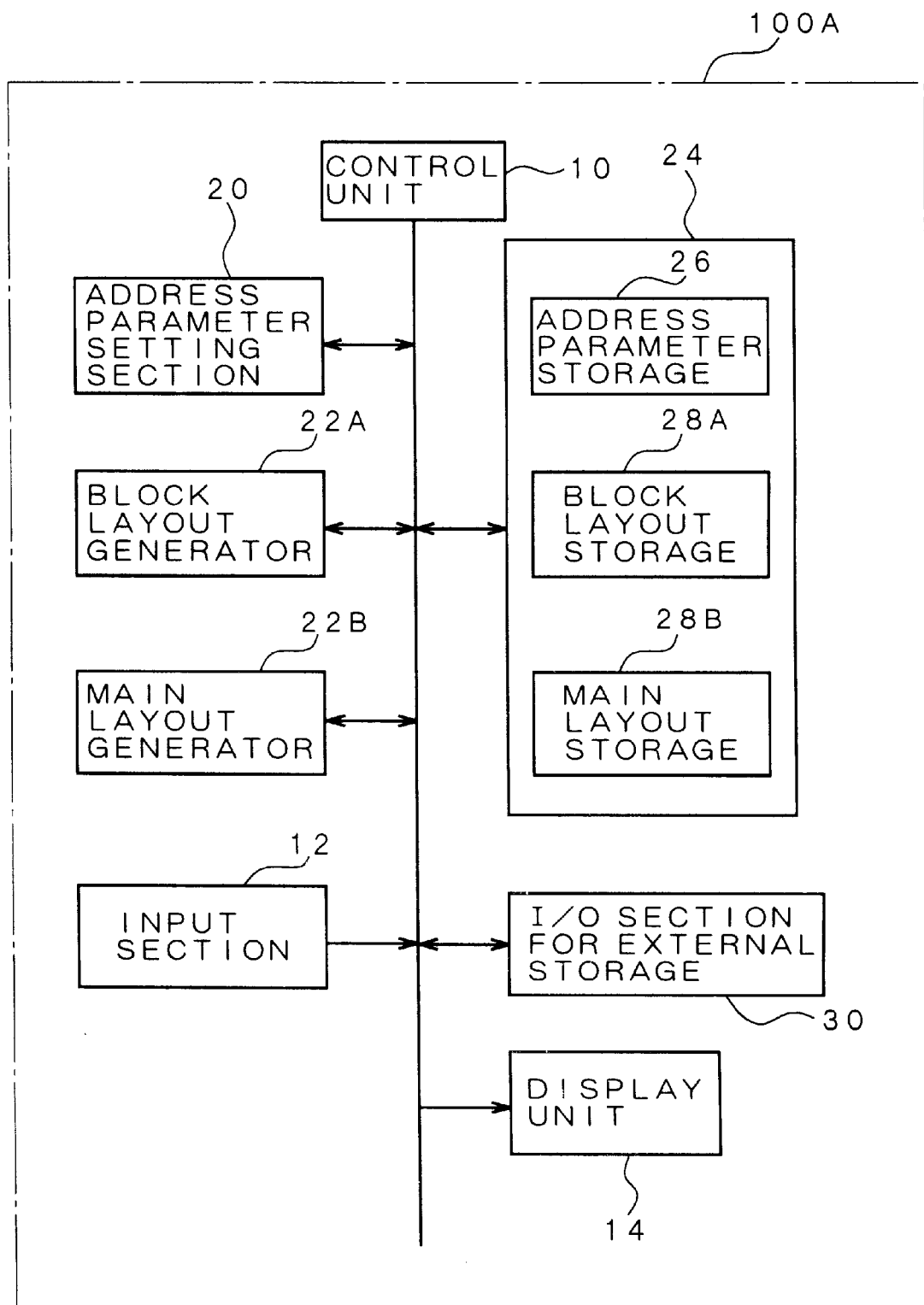
FIG. 26 is a block diagram showing the structure of an editing apparatus for physical conversion definition, which corresponds to a modified example.

FIG. 26 is a diagram showing the structure of an editing apparatus for physical conversion definition that corresponds to the modifies example. The editing apparatus 100A shown in FIG. 26 has the structure of replacing the layout generator 22 included in the editing apparatus 100 shown in FIG. 1 to a block layout generator 22A and a main layout generator 22B, and replacing the layout storage 28 to a block layout storage 28A and a main layout storage 28B.

Figure 27:
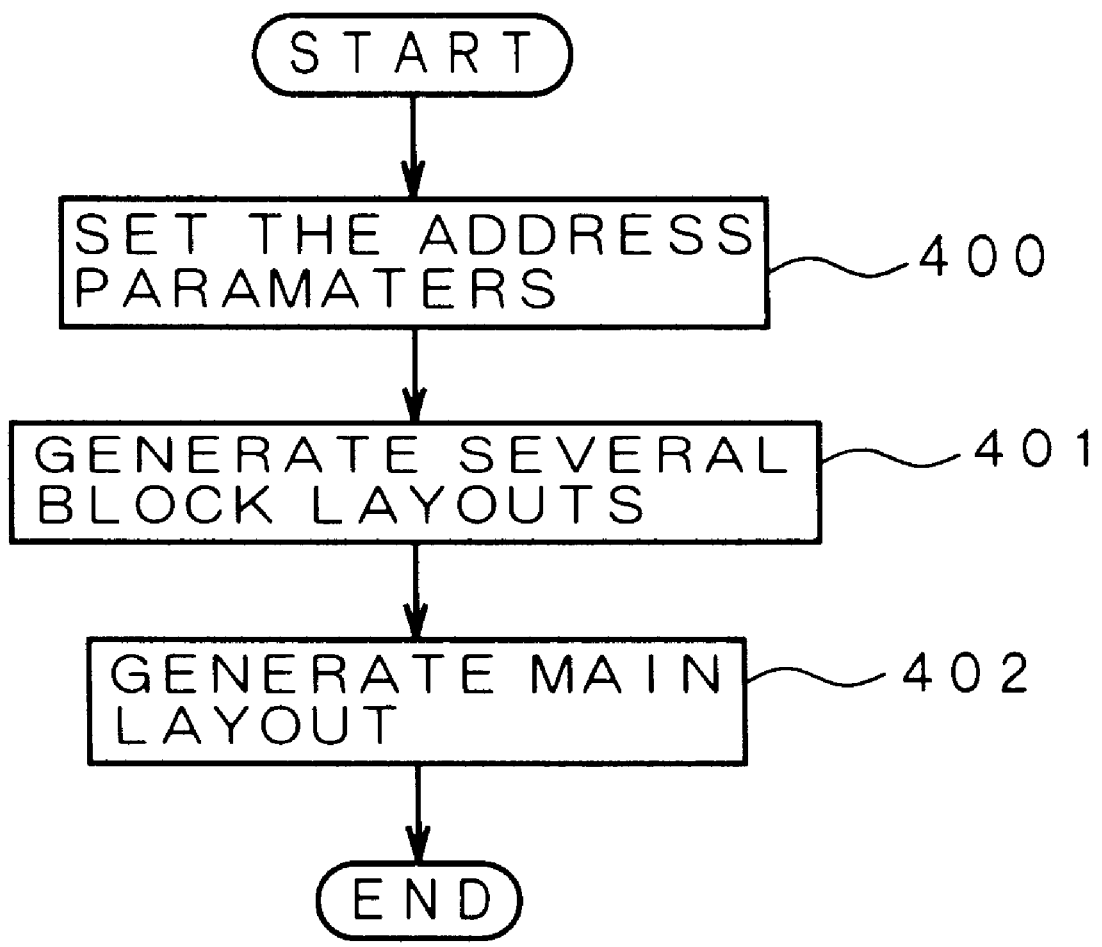
FIG. 27 is a flow chart showing operating procedure for generating physical conversion definition by the editing apparatus for physical conversion definition, which is shown in FIG. 26.
Figure 28A:
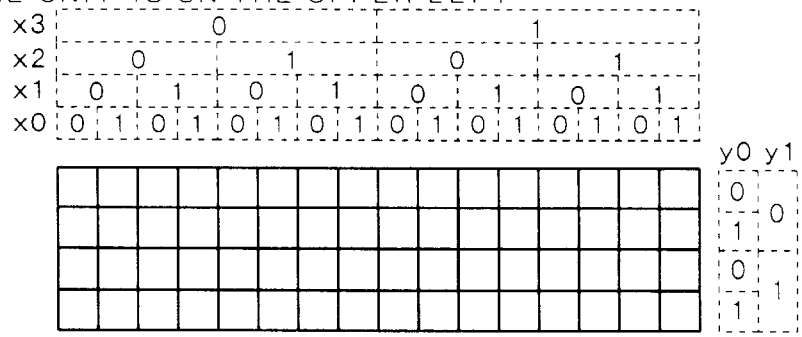
FIGS. 28A through 28D are diagrams showing concrete examples of unit layouts.
Figure 28B:
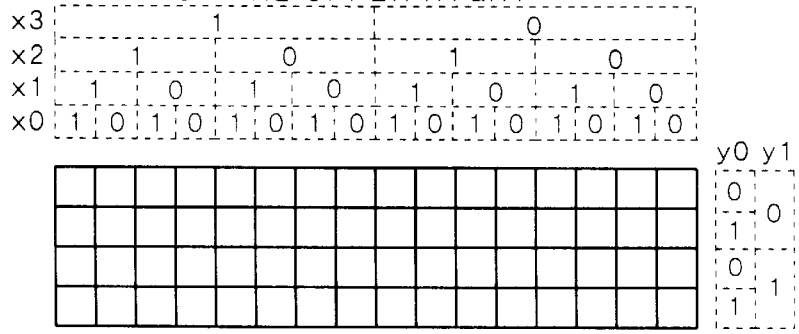
Figure 28C:
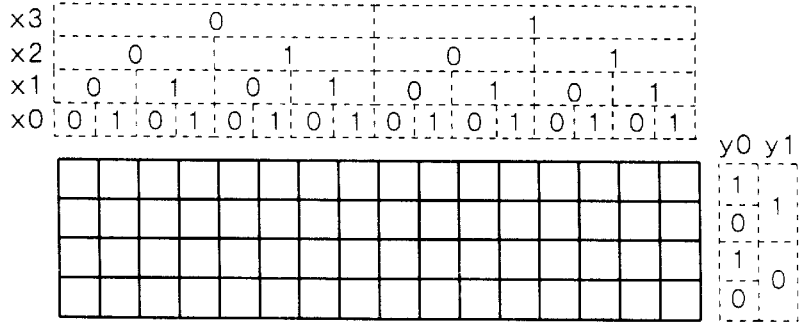
Figure 28D:
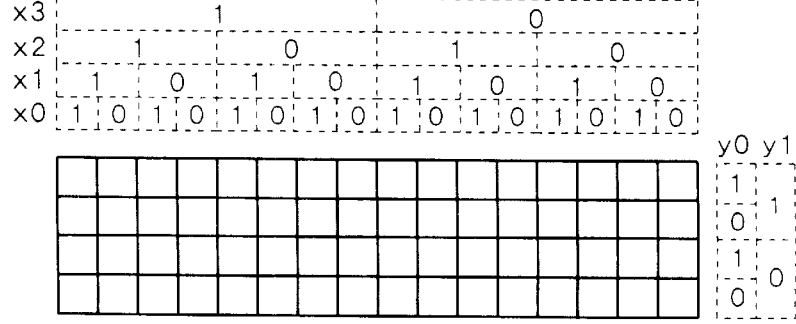

FIG. 27 is a flow chart showing the operating procedure for generating physical conversion definition by the editing apparatus 100A under the restrictions described above. First, the address parameter setting section 20 sets the following parameters as address parameters necessary for physical conversion definition (step 400):

Axes and origin of physical address

Axes of logical address in unit

Number of bits of high-order address of logical address X

Number of bits of low-order address of logical address X

Number of bits of high-order address of logical address Y

Number of bits of low-order address of logical address Y

Number of bits of I/O number

The number of bits of a logical address X is obtained by adding the number of bits of a high-order address of a logical address X to the number of bits of a low-order address. Similarly, the number of bits of a logical address Y is obtained by adding the number of bits of a high-order address of a logical address Y to the number of bits of a low-order address.

According to the number of bits of respective low-order addresses of logical addresses X and Y, the size of a unit layout is decided. Owing to this, the width and height of a unit layout should be the nth power of 2 (n=0, 1, 2, . . . ).

In addition, axes of logical addresses in a unit decide which of the horizontal and vertical directions is the direction to which the logical addresses X and Y are consecutive. Therefore, the axes are selected from two kinds of combinations, that is, a combination of X in the horizontal direction and Y in the vertical direction, and a combination of Y in the horizontal direction and X in the vertical direction.

For example, if the address parameters are set at the following numbers:

Axes of logical address in unit: the horizontal direction is X and the vertical direction is Y.

Number of bits of high-order address of logical address X: 2 bits

Number of bits of low-order address of logical address X: 4 bits

Number of bits of high-order address of logical address Y: 2 bits

Number of bits of low-order address of logical address Y: 2 bits

Then, the number of bits of the logical address X is 6 bits composed of x0–x5, and the number of bits of the logical address Y is 4 bits composed of y0–y3. Among these bits, according to the restrictions 4 and 5 that are described above, bits x4, x5, y2, and y3 that are in the high-order address can be freely specified in a block layout and a main layout, but bits x0–x3, y0, and y1 that are in the low-order address cannot be specified in these layouts. In addition, according to the restriction 3 described above, a unit layout becomes one of four layouts shown in FIGS. 28A through 28D. Owing to this, generating work of unit layouts is omitted, and the position of an origin of logical addresses in a unit is specified instead of a unit layout name at the time of generating a block layout.

In addition, each of unit layouts shown in FIGS. 28A through 28D is composed of 64 memory cells and has an high-order address and an I/O number which have a value of zero. Furthermore, the number of bits of a low-order address also can be 0. If the low-order address of a logical address in the vertical direction is 0, the number of memory cells of a unit layout in the vertical direction is 1, and hence, the vertical position of the origin specified to the unit is irrelevant. If the low-order address of a logical address in the horizontal direction is 0, the number of memory cells of a unit layout in the horizontal direction is 1, and hence, the horizontal position of the origin specified to the unit is irrelevant. If both low-order addresses of logical addresses in the vertical and horizontal directions are 0, the position of the origin specified to the unit is irrelevant, and the unit itself represents one memory cell. This case is equal to nesting in one level.

Next, the block layout generator 22A generates several block layouts for specifying them to respective elements (blocks) in a main layout that is the layout in the highest level (step 401). Although this work is almost the same as the layout generation without restrictions by the editing apparatus 100, different portions are:

Instead of specifying a layout name to each element, an origin of logical addresses in a unit is specified.

A low-order address cannot be specified to each element.

Figure 29:
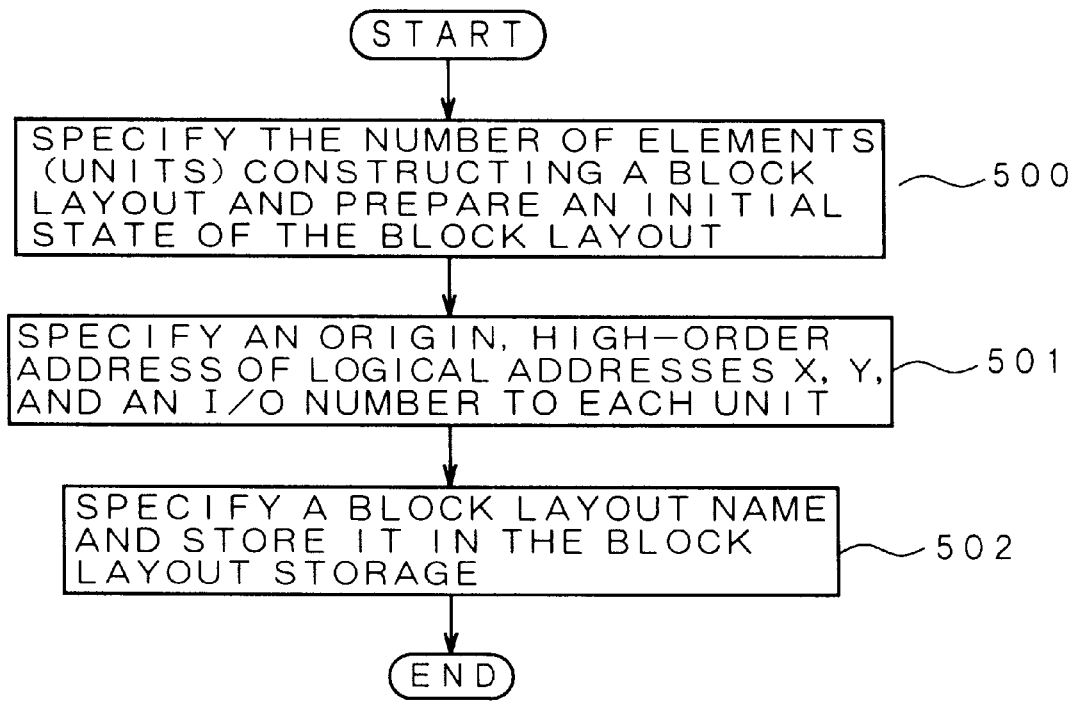
FIG. 29 is a flow chart showing operating procedure for generating a block layout.

Thus, the block layout generator 22A, as shown in FIG. 29, generates a block layout in the following sequence. First, the layout generator 22A specifies the number of elements (units) constructing a block layout and prepares an initial state of the block layout to each unit (step 500). Next, the layout generator 22A specifies an origin, high-order addresses of logical addresses X and Y, and an I/O number (step 501). Furthermore, the layout generator 22A stores the layout in the block layout storage 28A after specifying a block layout name for identifying the block layout to the block layout (step 502).

After generation of a block layout in this manner, the main layout generator 22B finally generates the layout in the highest level (step 402). Although this work is almost the same as the layout generation without restrictions by the editing apparatus 100, different portions are:

A layout name of each element is limited to layout names stored in the block layout storage 28A.

A low-order address cannot be specified to each element, but is fixed to zero.

An I/O number cannot be specified to each element, but is fixed to zero.

A layout name is not specified.

Figure 30:
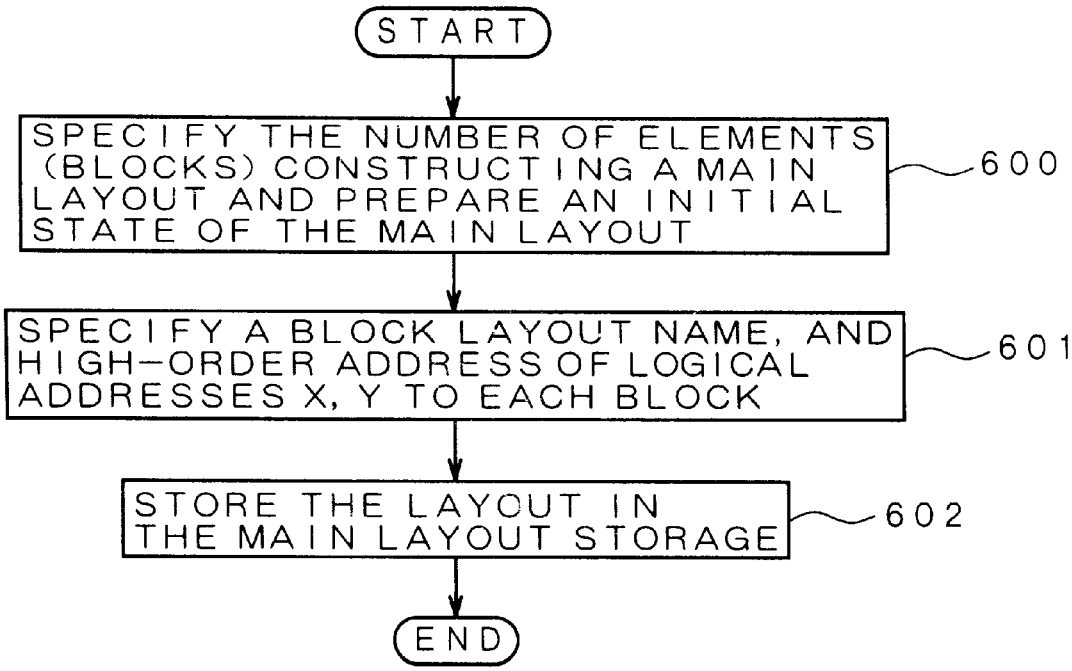
FIG. 30 is a flow chart showing operating procedure for generating a main layout.

Thus, the main layout generator 22B, as shown in FIG. 30, generates a main layout in the following sequence. Thus, the main layout generator 22B specifies the number of elements (blocks) constructing a main layout and prepares an initial state of the main layout (step 600). Next, the generator 22B specifies a block layout name, and high-order addresses of logical addresses X and Y (step 601). Furthermore, the generator 22B stores the layout in the main layout storage 28B (step 602).

Next, a concrete example of generating the physical conversion definition according to the procedure shown in FIG. 27 will be described. It is assumed that the physical conversion definition to be finally generated is the physical conversion definition shown in FIG. 16.

First, in the processing of setting address parameters at step 400 that is described above, the following address parameters are set:

Axes and origin of physical address: the origin is on the upper right, the X-axis is in the horizontal direction, and the Y-axis is in the vertical direction (the combination shown in FIG. 3B).

Axes of logical addresses in unit: the X-axis is in the horizontal direction, and the Y-axis is in the vertical direction.

Number of bits of high-order address of logical address X: 2 bits

Number of bits of low-order address of logical address X: 4 bits

Number of bits of high-order address of logical address Y: 2 bits

Number of bits of low-order address of logical address Y: 2 bits

Number of bits of I/O number: 2 bits

Figure 31:
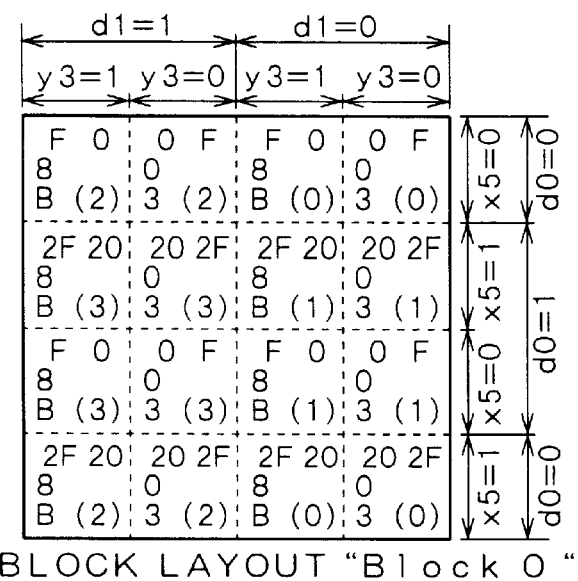
FIG. 31 is a diagram showing a concrete example of a block layout.
Figure 32:
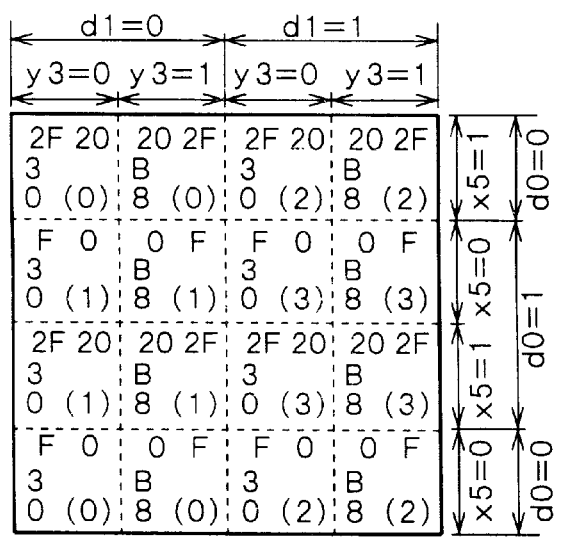
FIG. 32 is a diagram showing a concrete example of a block layout.

Next, the block layouts at step 401 that are described above are generated. In this editing apparatus 100A that is a modified example, at least block layouts "Block 0" and "Block 1" that are shown in FIGS. 31 and 32 should be generated. This is because bit inversion of the low-order addresses and I/O number cannot be performed since the low-order addresses and I/O number cannot be specified in the main layout.

Figures 33, 34:
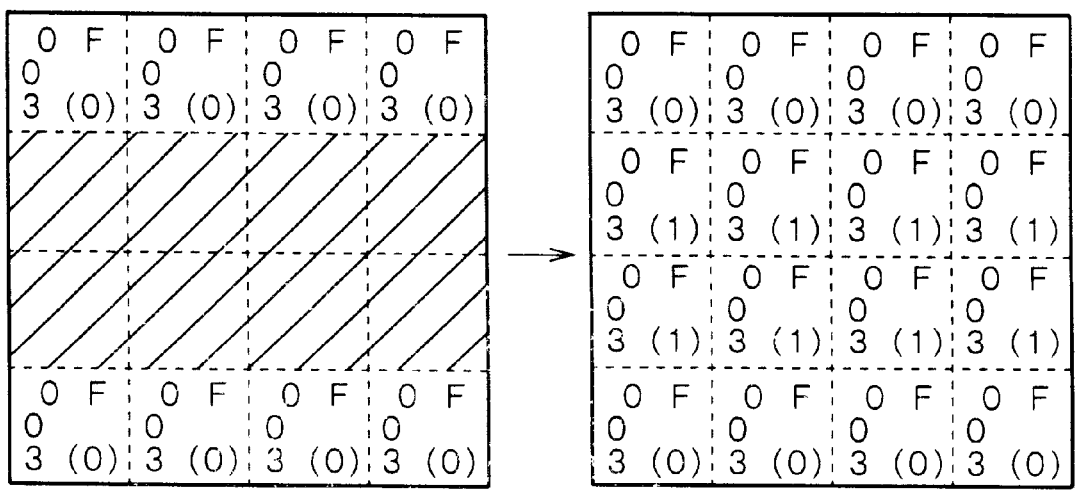
FIG. 33 is a diagram showing a concrete example of a block layout in an initial state.
FIG. 34 includes diagrams showing a concrete example of a block layout on the way of generation.
Figure 35:
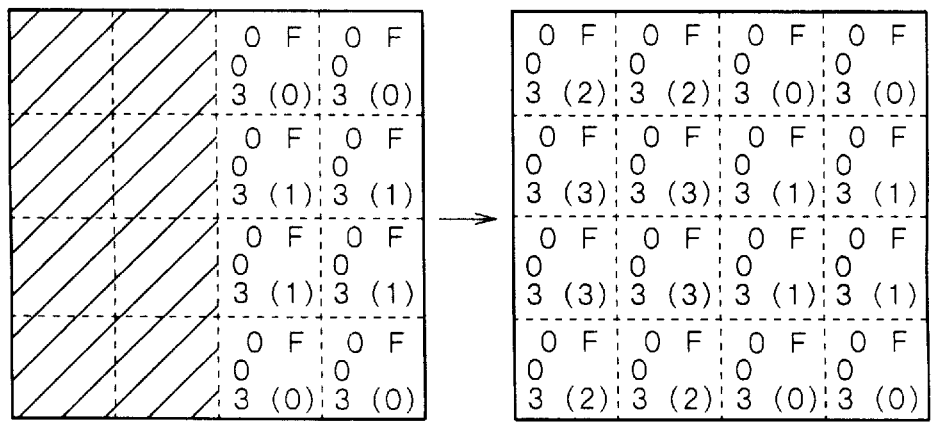
FIG. 35 includes diagrams showing a concrete example of a block layout on the way of generation.
Figure 36:
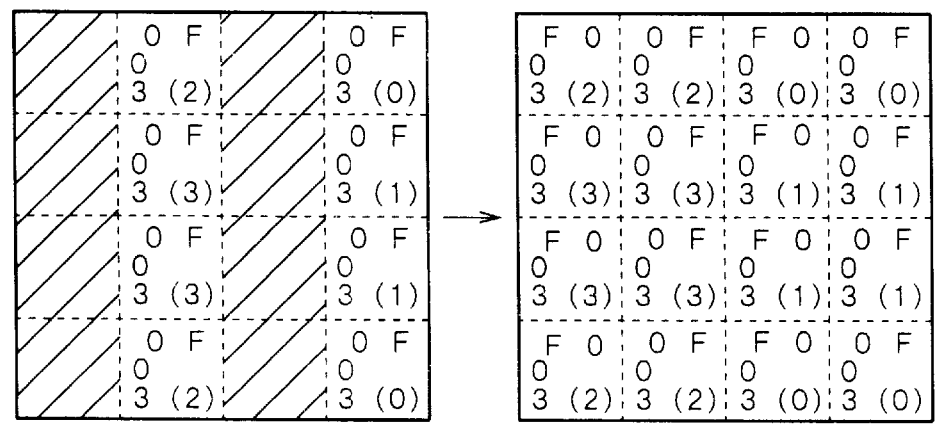
FIG. 36 includes diagrams showing a concrete example of a block layout on the way of generation.
Figure 37:
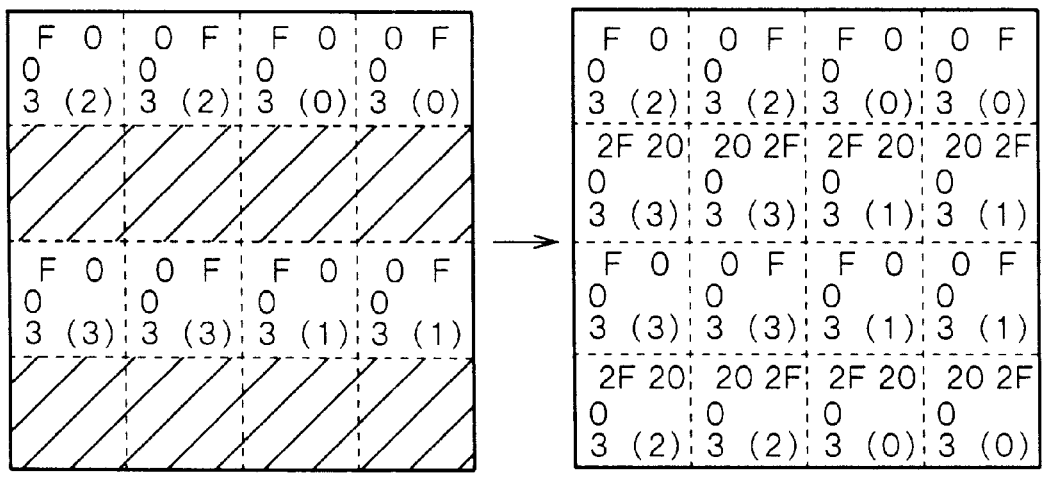
FIG. 37 includes diagrams showing a concrete example of a lock layout on the way of generation.
Figure 38:
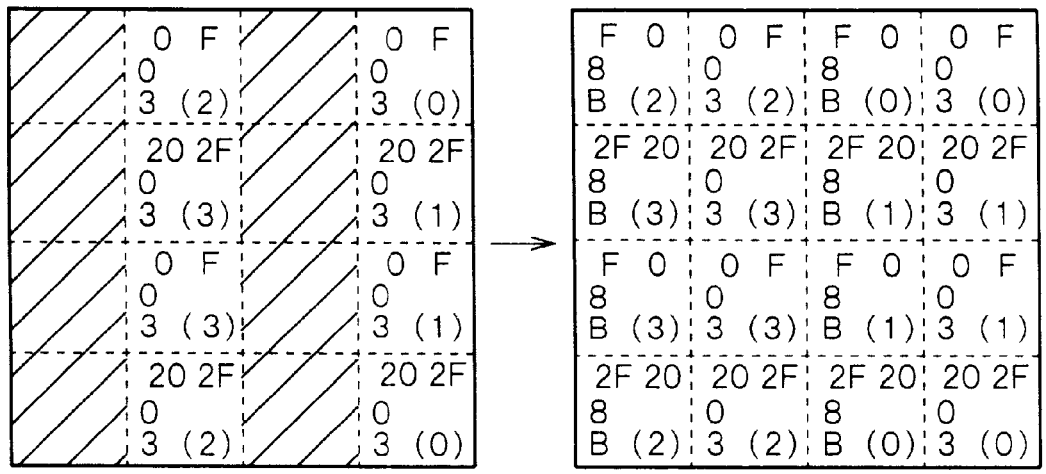
FIG. 38 includes diagrams showing a concrete example of a block layout on the way of generation.
Figure 42:
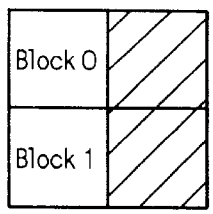
FIG. 42 includes diagrams showing a concrete example of a main layout on the way of generation.

The procedure for generating the block layout "Block 0" according to the generating procedure of a block layout shown in FIG. 29 will be concretely described. First, the block layout generator 22A specifies the number, that is, 4×4 of units constructing a block layout and prepares an initial state of the 4×4 block layout shown in FIG. 33 (step 500). In the initial state of this block layout, high-order addresses and I/O numbers are set at 0 in all the units, and the origin is on the upper left.

Next, the block layout generator 22A specifies an origin, high-order addresses of logical addresses X and Y, and an I/O number for each unit (step 501). The specification sequence of these parameters is optional. For example, states of the block layout at respective steps in case of the parameters being specified in the sequence of d0, d1, the origin, x5, and y3 are shown in FIGS. 34 through 38. In addition, high-order addresses x4 and y2 that have nothing specified are made to maintain their initial states (x4=0, y2=0) in every unit.

The generator 22A stores the layout in the block layout storage 28A after naming the block layout "Block 0" (step 502). Hereinabove, the block layout "Block 0" is completed.

Next, the block layout "Block 1" also should be generated. Nevertheless, the block layout "Block 1" can be easily obtained by inverting all the bits of low-order addresses (y0 and y1), x5, y3, and d1 in the vertical direction that is included in the block layout "Block 0." Therefore, it is preferable that the block layout generator 22A has a function that can easily generate such a block layout.

In addition, bit operation of inverting all the bits of the low-order addresses in the horizontal direction corresponds to the processing of inverting the horizontal positions of an origin assigned to a unit. Furthermore, bit operation of inverting all the bits of the low-order addresses in the vertical direction corresponds to the processing of inverting the vertical positions of an origin assigned to a unit.

Next, generation of a main layout at step 402 that is described above is performed. First, the main layout generator 22B specifies the number, that is, 2×2 of elements constructing a main layout and prepares an initial state of the 2×2 main layout (step 600). In this initial state of the main layout, a block layout name is not specified in all the blocks, and high-order addresses are set at 0.

Next, the main layout generator 22B specifies a block layout name, and high-order addresses of logical addresses X and Y (step 601). The specification sequence of these parameters is optional. For example, states of the physical conversion definition at respective steps in case of the parameters being specified in the sequence of a block layout name, x4, y2, and y3 are shown in FIGS. 39 through 42. In addition, each high-order address x5 that has nothing specified is made to maintain its initial state (x5=0) in every block.

The main layout generator 22B stores the main layout generated in such way in the main layout storage 28B (Step 602).

In this manner, it is possible to further increase working efficiency by providing several restrictions for simplification and acceleration of physical conversion processing. In addition, concrete advantages of generating the physical conversion definition in this manner are as follows:

(1) A user can set the sequence of address assignment in a block layout. In this embodiment, the sequence of assigning logical addresses in the block layout is decided with the high-order addresses of the logical addresses. Therefore, it is possible to optionally set the sequence of assigning logical addresses in the block layout by devising these high-order addresses.

(2) It becomes possible to define a block layout where a logical address is not consecutive in a block. In this embodiment, the sequence of logical addresses in physical conversion definition is decided with the high-order address of logical addresses. Therefore, it is not necessary that the logical addresses are consecutive in one block, but, as shown in FIG. 49, it is possible to generate such physical conversion definition that logical addresses become consecutive through a plurality of blocks.

(3) It becomes possible to generate such physical conversion definition that sizes of blocks are different from each other. Although it is necessary in this embodiment that sizes of respective units which are decided with low-order addresses of logical addresses are uniform, it is not necessary that sizes of blocks are the same. Therefore, as shown in FIG. 50, it is possible to generate such physical conversion definition that sizes of a part of blocks are different from each other.

(4) It is possible to generate such physical conversion definition that not all logical addresses are included. Although, in this embodiment, whether logical addresses are consecutive over the entire main layout is decided by setting of high-order addresses of the logical addresses, it is also possible to set the high-order address lest the high-order address should be consecutive. Therefore, it is also possible to perform setting lest the logical address corresponding to this discontinuous high-order address (high-order address not included) should be included.

(5) Since sizes of respective units are made to be uniform, it is possible to avoid occurrence of an error caused by improper rules for assigning a logical address like a conventional case that sizes of units are different from each other.

(6) It is not necessary to set a sequence number before assignment work of logical addresses, and hence it is not necessary to consider fitness of the setting. In this embodiment, the sequence of the entire logical addresses is specified by directly specifying high-order addresses of the logical addresses, and the sequence number is not used. Therefore, it is possible to generate physical conversion definition without using the sequence number suitable setting of which is difficult.

(7) A position of an origin of a physical address can be set optionally. In this embodiment, the position of the origin of the physical address is included in address parameters, and hence it becomes possible to set the position optionally.

In addition, in the modified example of this embodiment, the restriction that an I/O number cannot be specified in a main layout is added. Nevertheless, with deleting this restriction, it is also possible to perform exclusive OR operation between the I/O number specified to a unit in a block layout and the I/O number specified to a block in the main layout.

What is claimed is:

1. An editing apparatus for physical conversion definition that generates physical conversion definition for obtaining a logical address from a physical address of semiconductor memory, comprising:

address parameter setting means for specifying address parameters including information relating to setup contents of said physical address and said logical address;

address parameter storage means for storing said address parameters specified by said address parameter setting means;

layout generating means for generating a layout composed of a plurality of elements by setting a plurality of elements whose structural unit is one memory cell of semiconductor memory or a plurality of the memory cells adjacent to each other, and specifying said logical address to each of these elements; and layout storage means for storing said layout generated by said layout generating means.

2. The editing apparatus for physical conversion definition according to claim 1, wherein said address parameters include axes and an origin of said physical address and numbers of bits of said logical address.

3. The editing apparatus for physical conversion definition according to claim 2, wherein said axes of the physical address include the X-axis and Y-axis of said physical address.

4. The editing apparatus for physical conversion definition according to claim 2, wherein said numbers of bits of the logical address include a number of bits of an I/O number, a number of bits of a logical address X, a number of bits of a logical address Y, and a number of bits of logical address Z.

5. The editing apparatus for physical conversion definition according to claim 2, wherein, when said layouts are included in the same level, said layout generating means sets a logical address of another layout in the same level by inverting contents of at least a part of structural bits of a logical address corresponding to any layout.

6. The editing apparatus for physical conversion definition according to claim 1, wherein said layout generated by said layout generating means has a hierarchical structure, and wherein each element included in said layout in the lowest level corresponds to said memory cell of the semiconductor memory.

7. The editing apparatus for physical conversion definition according to claim 6, wherein said each layout in the lowest level has the same size as others and said logical address in the same direction as those of others and corresponds to low-order bits of said logical address, and wherein specification of said layout in the lowest level in said layout that corresponds to a level immediately higher than the lowest level is performed by specifying a position of an origin.

8. The editing apparatus for physical conversion definition according to claim 1, wherein said layout generating means has a function of specifying a number of elements constructing said layout and a function of specifying said logical address per bit to said element selected.

9. The editing apparatus for physical conversion definition according to claim 1, wherein said layout generating means generates said layout according to a predetermined rule for deciding physical conversion definition.

10. A generating method for physical conversion definition for generating physical conversion definition for obtaining a logical address from a physical address of semiconductor memory, comprising:

a first step of specifying address parameters including information relating to setting contents of said physical address and said logical address; and a second step of generating a layout composed of a plurality of elements by setting the plurality of elements whose structural unit is one memory cell of said semiconductor memory or a plurality of memory cells adjacent to each other, and specifying said logical address to each of these elements.

11. The generating method for physical conversion definition according to claim 10, wherein said address parameters include axes and an origin of said physical address and numbers of bits of said logical address.

12. The generating method for physical conversion definition according to claim 11, wherein said axes of the physical address include the X-axis and Y-axis of said physical address.

13. The generating method for physical conversion definition according to claim 11, wherein said numbers of bits of the logical address include a number of bits of an I/O number, a number of bits of a logical address X, a number of bits of a logical address Y, and a number of bits of logical address Z.

14. The generating method for physical conversion definition according to claim 10, wherein said layout has a hierarchical structure, and wherein each element included in said layout in the lowest level corresponds to said memory cell of the semiconductor memory.

15. The generating method for physical conversion definition according to claim 10, wherein the second step comprises:

a third step of defining a predetermined unit where a logical address is consecutive as a first area, constructing a second area by arranging said first areas in a grid-like pattern, and making a low-order address of said logical address correspond to each of said first areas;

a fourth step of setting a part of value of a high-order address in addition to the low-order address; and a fifth step of arranging said second areas, having the same contents or different contents, in a grid-like pattern and setting residual value of the high-order address, and wherein the generating method generates physical conversion definition for obtaining said logical address from said physical address by assigning said logical address composed of said low-order address and said high-order address.

16. The generating method for physical conversion definition according to claim 15, wherein said first area has the same size as other areas and said logical address in the same direction as those of other areas and wherein specification of said first area is performed by specifying a position of an origin.

* * * * *